United States Patent
Park

(10) Patent No.: US 10,923,166 B2
(45) Date of Patent: Feb. 16, 2021

(54) SEMICONDUCTOR DEVICES PERFORMING A WRITE LEVELING TRAINING OPERATION AND SEMICONDUCTOR SYSTEMS INCLUDING THE SEMICONDUCTOR DEVICES

(71) Applicant: SK hynix Inc., Icheon-si (KR)

(72) Inventor: Min Su Park, Seoul (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/663,158

(22) Filed: Oct. 24, 2019

(65) Prior Publication Data

US 2020/0058336 A1  Feb. 20, 2020

Related U.S. Application Data

(63) Continuation of application No. 16/523,862, filed on Jul. 26, 2019, which is a continuation-in-part of
(Continued)

(30) Foreign Application Priority Data

Feb. 27, 2018 (KR) .......................... 10-2018-0024048

(51) Int. Cl.
*G11C 7/00* (2006.01)
*G11C 7/22* (2006.01)
(Continued)

(52) U.S. Cl.
CPC ............ *G11C 7/222* (2013.01); *G06F 3/0634* (2013.01); *G06F 3/0659* (2013.01); *G11C 7/106* (2013.01);
(Continued)

(58) Field of Classification Search
CPC ....... G11C 7/222; G11C 7/1057; G11C 7/106; G11C 7/1069; G11C 7/1063;
(Continued)

(56) References Cited

U.S. PATENT DOCUMENTS 8,243,534 B2 *  8/2012  Fujisawa ................... G11C 7/22
                                                                    365/193
8,503,254 B2 *  8/2013  Park ...................... G11C 7/1078
                                                                 365/189.07
(Continued)

FOREIGN PATENT DOCUMENTS

KR            101585213 B1     1/2016

OTHER PUBLICATIONS

Dongkyun Kim et al., 23.2 A 1.1V 1ynm 6.4Gb/s/pin 16Gb DDR5 SDRAM with a Phase-Rotator-Based DLL, High-Speed SerDes and RX/TX Equalization Scheme, ISSCC 2019/Session 23/DRAM/23. 2, Feb. 17, 2019 to Feb. 21, 2019, pp. 380-381, Icheon, Korea.

*Primary Examiner* — Viet Q Nguyen
(74) *Attorney, Agent, or Firm* — William Park & Associates Ltd.

(57) ABSTRACT

A method includes performing a first write leveling training operation and performing a second write leveling training operation. The first write leveling training operation is performed to generate transmission data based on a data strobe signal and an internal command pulse and to generate a latency code. The second write leveling training operation is performed to generate the transmission data based on the data strobe signal and the internal command pulse.

6 Claims, 22 Drawing Sheets

Related U.S. Application Data application No. 16/119,285, filed on Aug. 31, 2018, now Pat. No. 10,777,242.

(51) Int. Cl.
*G06F 3/06* (2006.01)
*G11C 7/10* (2006.01)

(52) U.S. Cl.
CPC ............ *G11C 7/109* (2013.01); *G11C 7/1057* (2013.01); *G11C 7/1063* (2013.01); *G11C 7/1066* (2013.01); *G11C 7/1069* (2013.01); *G11C 7/1084* (2013.01); *G11C 7/1087* (2013.01); *G11C 7/1093* (2013.01); *G11C 7/1096* (2013.01)

(58) Field of Classification Search
CPC ..... G11C 7/1084; G11C 7/1087; G11C 7/109; G11C 7/1093; G11C 7/1096; G06F 3/0634; G06F 3/0659
USPC .......................................................... 365/193
See application file for complete search history.

(56) References Cited

U.S. PATENT DOCUMENTS

| | | | | |
|---|---|---|---|---|
| 8,565,033 B1* | 10/2013 | Manohararajah | .... | G11C 29/023 365/193 |
| 8,775,761 B2* | 7/2014 | Ok | ........ | G11C 7/1093 711/167 |
| 8,780,655 B1* | 7/2014 | Kumar | ................. | G11C 7/1066 365/194 |
| 8,917,563 B2* | 12/2014 | Miyano | ............... | G11C 11/4076 365/194 |
| 9,106,458 B2* | 8/2015 | Song | .................... | G11C 7/1063 |
| 9,536,590 B1* | 1/2017 | Zhu | .......................... | G11C 7/10 |
| 9,881,662 B2* | 1/2018 | Giovannini | ............... | G06F 5/06 |
| 9,892,772 B2* | 2/2018 | Song | .................... | G11C 7/222 |
| 10,269,443 B2* | 4/2019 | Yu | ........................ | G11C 11/4076 |
| 10,360,951 B1* | 7/2019 | Penney | ................ | G11C 7/1093 |
| 10,418,125 B1* | 9/2019 | Lin | ..................... | G11C 11/4094 |
| 10,452,319 B1* | 10/2019 | Penney | ................ | G06F 3/0611 |
| 10,497,413 B1* | 12/2019 | Lin | ...................... | G11C 29/028 |
| 10,580,465 B2* | 3/2020 | Takefman | ........... | G11C 7/1093 |
| 10,622,041 B2* | 4/2020 | Kim | ...................... | G11C 11/4096 |
| 2003/0217225 A1 | 11/2003 | Jang et al. | | |
| 2011/0187427 A1 | 8/2011 | Kim et al. | | |
| 2012/0113728 A1 | 5/2012 | Kwon et al. | | |
| 2014/0177359 A1* | 6/2014 | Kumar | ................. | G11C 7/1093 365/194 |
| 2014/0286119 A1* | 9/2014 | Jeon | ..................... | G06F 3/0629 365/230.08 |
| 2014/0317470 A1 | 10/2014 | Chung et al. | | |
| 2014/0321229 A1* | 10/2014 | Duffner | ................ | G11C 7/1009 365/233.13 |
| 2014/0334243 A1* | 11/2014 | Duffner | ................ | G11C 29/022 365/233.13 |
| 2015/0243343 A1 | 8/2015 | Giovannini et al. | | |
| 2015/0364173 A1 | 12/2015 | Kim et al. | | |
| 2016/0172013 A1 | 6/2016 | Dearth et al. | | |
| 2018/0286471 A1 | 10/2018 | Hotaruhara | | |
| 2019/0244644 A1 | 8/2019 | Komatsu et al. | | |
| 2019/0259433 A1 | 8/2019 | Penney et al. | | |
| 2020/0201705 A1* | 6/2020 | Kim | ...................... | G11C 7/222 |

* cited by examiner

FIG.22

|  | tWPRE = 2tck | tWPRE = 3tck | tWPRE = 4tck |
|---|---|---|---|
| Negative offset | -0.75 tck | -1.25 tck | -2.25 tck |
| Positive offset | 1.25 tck | 1.75 tck | 2.75 tck | ion Ser. No. 16/523,862, filed on Jul. 26, 2019, which is a
SEMICONDUCTOR DEVICES PERFORMING A WRITE LEVELING TRAINING OPERATION AND SEMICONDUCTOR SYSTEMS INCLUDING THE SEMICONDUCTOR DEVICES

CROSS-REFERENCE TO RELATED APPLICATIONS

This application is a continuation of U.S. patent application Ser. No. 16/523,862, filed on Jul. 26, 2019, which is a continuation-in-part of U.S. patent application Ser. No. 16/119,285, filed on Aug. 31, 2018, which claims the priority under 35 U.S.C. § 119(a) to Korean Patent Application No. 10-2018-0024048, filed on Feb. 27, 2018 in the Korean Intellectual Property Office.

BACKGROUND

1. Technical Field

Embodiments of the present disclosure relate to semiconductor devices and semiconductor systems including the same and, more particularly, to semiconductor devices performing a write leveling training operation for aligning an internal data strobe signal with an internal command pulse and semiconductor systems including the semiconductor devices.

SUMMARY

According to an embodiment, there is provided a method of performing a write leveling training operation. The method includes performing an external write leveling training operation and performing an internal write leveling training operation. The external write leveling training operation is performed to generate transmission data based on a data strobe signal and an internal command pulse and to generate a latency code by controlling a delay period of the data strobe signal based on the transmission data. The internal write leveling training operation is performed to generate the transmission data based on the data strobe signal and the internal command pulse, which is generated by the latency code and an offset code, to control the offset code based on the transmission data, and to control a delay period of the data strobe signal based on the transmission data.

BRIEF DESCRIPTION OF THE DRAWINGS

FIG. 22 is a table illustrating a negative offset and a positive offset which are set according to a preamble period of a data strobe signal.

DETAILED DESCRIPTION

Various embodiments of the present invention will be described in greater detail with reference to the accompanying drawings. The drawings are schematic illustrations of various embodiments. Thus, the described embodiments should not be construed as being limited to the particular configurations and shapes illustrated herein but may include deviations in configurations and shapes which do not depart from the spirit and scope of the present invention as defined in the appended claims.

The present invention is described herein with reference to cross-section and/or plan illustrations of idealized embodiments of the present invention. However, embodiments of the present invention should not be construed as limiting the inventive concept. Although a few embodiments of the present invention will be shown and described, it will be appreciated by those of ordinary skill in the art that changes may be made in these embodiments without departing from the principles and spirit of the present invention.

While terms such as "first" and "second" may be used to describe various components, such components must not be understood as being limited to the above terms. The above terms are used only to distinguish one component from another. For example, a first component may be referred to as a second component without departing from the scope of rights of the present disclosure, and likewise a second component may be referred to as a first component.

It will be understood that when an element is referred to as being "between" two elements, it can be the only element between the two elements, or one or more intervening elements may also be present.

The terms used in the present application are merely used to describe particular embodiments, and are not intended to limit the present disclosure. Singular forms in the present disclosure are intended to include the plural forms as well, unless the context clearly indicates otherwise. It will be further understood that terms such as "including" or "having," etc., are intended to indicate the existence of the features, numbers, operations, actions, components, parts, or combinations thereof disclosed in the specification, and are not intended to preclude the possibility that one or more other features, numbers, operations, actions, components, parts, or combinations thereof may exist or may be added.

Figure 1:
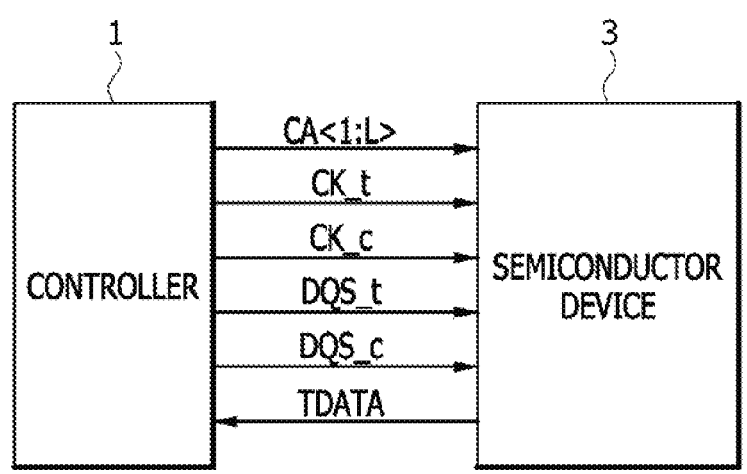
FIG. 1 is a block diagram illustrating a configuration of a semiconductor system in accordance with an embodiment.

As illustrated in FIG. 1, a semiconductor system 100, according to an embodiment, may include a controller 1 and a semiconductor device 3.

The controller 1 may generate and transmit a control signal CA<1:L>, a clock signal CK_t, a complementary clock signal CK_c, a data strobe signal DQS_t, and a complementary data strobe signal DQS_c to the semiconductor device 3. The controller 1 may generate the control signal CA<1:L> including a command and an address and may output the control signal CA<1:L> to the semiconductor device 3. The clock signal CK_t and the complementary clock signal CK_c may be generated to have different phases which are opposite of each other. The data strobe signal DQS_t and the complementary data strobe signal DQS_c may be generated to have different phases, which are opposite of each other. The controller 1 may generate and output the data strobe signal DQS_t and the complementary data strobe signal DQS_c at a point in time when a predetermined delay period, which is set by the controller 1, elapses from an initialized point in time. The controller 1 may receive transmission data TDATA from the semiconductor device 3. The controller 1 may control the predetermined delay period of the data strobe signal DQS_t and the complementary data strobe signal DQS_c based on the transmission data TDATA. The controller 1 may increase or reduce the predetermined delay period of the data strobe signal DQS_t and the complementary data strobe signal DQS_c based on a logic level of the transmission data TDATA. The controller 1 may control the predetermined delay period of the data strobe signal DQS_t and the complementary data strobe signal DQS_c such that the predetermined delay period in an external write leveling training mode is different from the predetermined delay period in an internal write leveling training mode. The controller 1 may transmit the data strobe signal DQS_t and the complementary data strobe signal DQS_c to the semiconductor device 3 at a point in time when the predetermined delay period elapses from a reference point in time. The reference point in time may be different according to the embodiments.

The word "predetermined" as used herein with respect to a parameter, such as a predetermined amount of time, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

The semiconductor device 3 may receive the control signal CA<1:L>, the clock signal CK_t, the complementary clock signal CK_c, the data strobe signal DQS_t, and the complementary data strobe signal DQS_c from the controller 1 to activate the external write leveling training mode or the internal write leveling training mode. The semiconductor device 3 may generate and transmit the transmission data TDATA to the controller 1 in the external write leveling training mode or the internal write leveling training mode.

The semiconductor system 100 may perform a control operation for minimizing a phase difference or a timing skew between the clock signal CK_t and the data strobe signal DQS_t at a point in time when the semiconductor device 3 receives the clock signal CK_t and the data strobe signal DQS_t from the controller 1, through the external write leveling training mode. In addition, the semiconductor system 100 may accurately control a phase difference or a timing skew between the clock signal CK_t and the data strobe signal DQS_t to minimize an internal delay period and power consumption of the semiconductor device 3, through the internal write leveling training mode.

Figure 2:
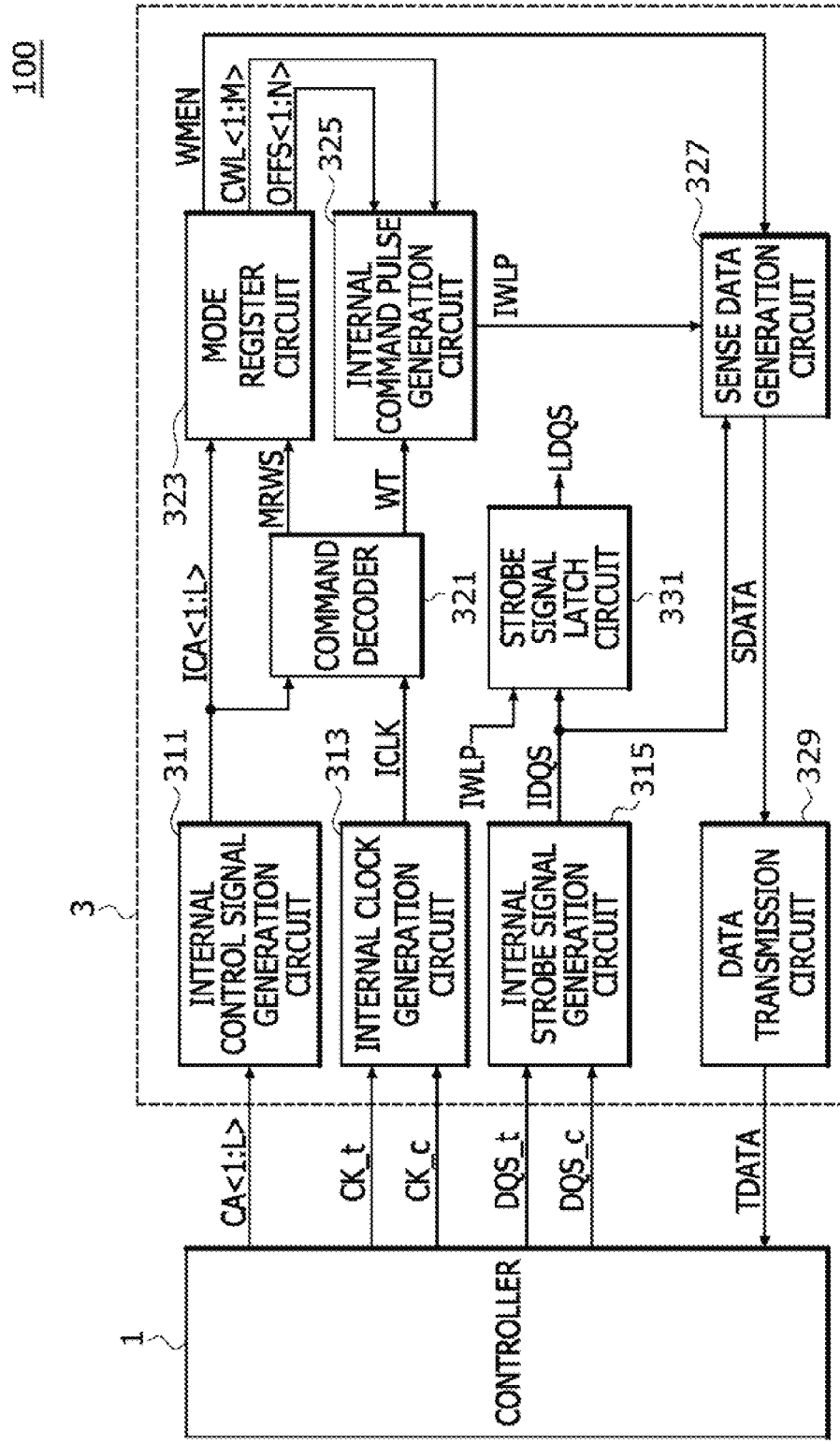
FIG. 2 is a block diagram illustrating a detailed configuration of the semiconductor system shown in FIG. 1.

A configuration and an operation of the semiconductor device 3, included in the semiconductor system 100, will be described more fully hereinafter with reference to FIG. 2.

The semiconductor device 3 may include an internal control signal generation circuit 311, an internal clock generation circuit 313, an internal strobe signal generation circuit 315, a command decoder 321, a mode register circuit 323, an internal command pulse generation circuit 325, a sense data generation circuit 327, a data transmission circuit 329, and a strobe signal latch circuit 331.

The internal control signal generation circuit 311 may buffer the control signal CA<1:L> to generate an internal control signal ICA<1:L>. According to the embodiments, the command and the address, included in the control signal CA<1:L>, may be inputted to the internal control signal generation circuit 311 in synchronization with a point in time (hereinafter, referred to as 'a rising edge') when a level of the clock signal CK_t is changed from a logic "low" level into a logic "high" level or a point in time (hereinafter, referred to as 'a falling edge') when a level of the clock signal CK_t is changed from a logic "high" level into a logic "low" level. The number "L" of bits, included in the control signal CA<1:L>, may be different according to the embodiments.

The internal clock generation circuit 313 may receive the clock signal CK_t and the complementary clock signal CK_c to generate an internal clock signal ICLK. The internal clock generation circuit 313 may amplify a level difference between the clock signal CK_t and the complementary clock signal CK_c to generate the internal clock signal ICLK. In some embodiments, the internal clock generation circuit 313 may be realized using a division circuit to generate the internal clock signal ICLK corresponding to a division signal of the clock signal CK_t. A configuration and an operation of the internal clock generation circuit 313 will be described more fully with reference to FIG. 3.

The internal strobe signal generation circuit 315 may receive the data strobe signal DQS_t and the complementary data strobe signal DQS_c to generate an internal data strobe signal IDQS. The internal strobe signal generation circuit 315 may amplify a level difference between the data strobe signal DQS_t and the complementary data strobe signal DQS_c to generate the internal data strobe signal IDQS. In some embodiments, the internal strobe signal generation circuit 315 may be realized using a division circuit to generate the internal data strobe signal IDQS corresponding to a division signal of the data strobe signal DQS_t. A configuration and an operation of the internal strobe signal generation circuit 315 will be described more fully with reference to FIG. 4.

The command decoder 321 may decode the internal control signal ICA<1:L> to generate a mode register write signal MRWS and a write signal WT. The command decoder 321 may generate the mode register write signal MRWS when the internal control signal ICA<1:L> has a first logic level combination. The command decoder 321 may generate the write signal WT when the internal control signal ICA<1:L> has a second logic level combination. The mode register write signal MRWS may be generated to perform a mode register write operation to extract information included in the internal control signal ICA<1:L> and to store the information into the mode register circuit 323. The write signal WT may be generated to perform a write operation. The first and second logic level combinations may be different according to the embodiments.

The mode register circuit 323 may generate a training mode selection signal WMEN, a latency code CWL<1:M>, and an offset code OFFS<1:N> from the internal control signal ICA<1:L> based on the mode register write signal MRWS. The mode register circuit 323 may extract the training mode selection signal WMEN from the internal control signal ICA<1:L> to store the training mode selection signal WMEN when the mode register write signal MRWS is generated.

The mode register circuit 323 may extract the latency code CWL<1:M> from the internal control signal ICA<1:L> to store the latency code CWL<1:M> when the mode register write signal MRWS is generated. The mode register circuit 323 may extract the offset code OFFS<1:N> from the internal control signal ICA<1:L> to store the offset code OFFS<1:N> when the mode register write signal MRWS is generated. A configuration and an operation of the mode register circuit 323 will be described more fully with reference to FIG.

The internal command pulse generation circuit 325 may generate an internal command pulse IWLP from the write signal WT based on the latency code CWL<1:M> and the offset code OFFS<1:N>. The internal command pulse generation circuit 325 may shift the write signal WT by a predetermined period, which is set by the latency code CWL<1:M>, to generate a shifted write signal (SWT of FIG. 6). In some embodiments, the internal command pulse generation circuit 325 may shift the write signal WT in synchronization with the internal clock signal ICLK. The latency code CWL<1:M> may have a logic level combination corresponding to a write latency period. The logic level combination of the latency code CWL<1:M>, corresponding to the write latency period, may be set through the external write leveling training mode. The logic level combination of the latency code CWL<1:M> corresponding to the write latency period may be different according to the embodiments. The internal command pulse generation circuit 325 may adjust a pulse width of the shifted write signal (SWT of FIG. 6), based on a period set by the offset code OFFS<1:N>, to generate the internal command pulse IWLP. A logic level combination of the offset code OFFS<1:N> may be set through the internal write leveling training mode. The logic level combination of the offset code OFFS<1:N>, for adjusting a pulse width of the shifted write signal (SWT of FIG. 6), may be different according to the embodiments. A configuration and an operation of the internal command pulse generation circuit 325 will be described more fully with reference to FIG. 6.

The sense data generation circuit 327 may generate sense data SDATA from the internal data strobe signal IDQS and the internal command pulse IWLP, based on the training mode selection signal WMEN. The training mode selection signal WMEN may have a first logic level to activate the external write leveling training mode and may have a second logic level to activate the internal write leveling training mode. During the external write leveling training mode, the sense data generation circuit 327 may latch the internal command pulse IWLP in synchronization with a delayed signal of the internal data strobe signal IDQS to output the latched signal of the internal command pulse IWLP as the sense data SDATA. During the internal write leveling training mode, the sense data generation circuit 327 may latch the internal command pulse IWLP in synchronization with the internal data strobe signal IDQS to output the latched signal of the internal command pulse IWLP as the sense data SDATA. The first and second logic levels may be different according to the embodiments. A configuration and an operation of the sense data generation circuit 327 will be described more fully with reference to FIG. 7 later.

The data transmission circuit 329 may generate the transmission data TDATA from the sense data SDATA and transmit the transmission data TDATA to the controller 1. The data transmission circuit 329 may include a drive circuit that drives the transmission data TDATA using the sense data SDATA. The transmission data TDATA may be generated to have the same logic level as the sense data SDATA.

The strobe signal latch circuit 331 may generate a latched data strobe signal LDQS from the internal command pulse IWLP based on the internal data strobe signal IDQS. The strobe signal latch circuit 331 may latch the internal command pulse IWLP in synchronization with a predetermined edge of the internal data strobe signal IDQS to output the latched pulse of the internal command pulse IWLP as the latched data strobe signal LDQS. A configuration and an operation of the strobe signal latch circuit 331 will be described more fully with reference to FIG. 8 later.

Figure 3:
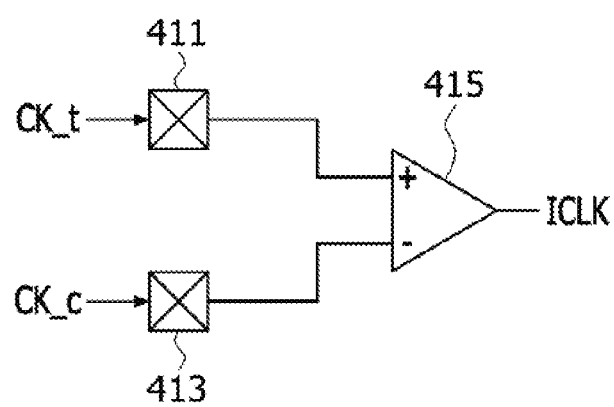
FIG. 3 is a circuit diagram illustrating an example of an internal clock generation circuit included in the semiconductor system of FIG. 2.

Referring to FIG. 3, the internal clock generation circuit 313 may include a first clock pad 411, a second clock pad 413, and a clock buffer 415. The clock buffer 415 may receive the clock signal CK_t through the first clock pad 411. The clock buffer 415 may receive the complementary clock signal CK_c through the second clock pad 413. The clock buffer 415 may amplify a level difference between the clock signal CK_t and the complementary clock signal CK_c to generate and output the internal clock signal ICLK.

Figure 4:
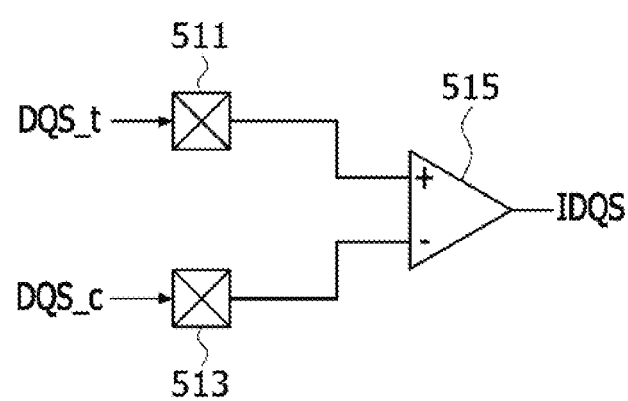
FIG. 4 is a circuit diagram illustrating an example of an internal strobe signal generation circuit included in the semiconductor system of FIG. 2.

Referring to FIG. 4, the internal strobe signal generation circuit 315 may include a first strobe pad 511, a second strobe pad 513, and a strobe buffer 515. The strobe buffer 515 may receive the data strobe signal DQS_t through the first strobe pad 511. The strobe buffer 515 may receive the complementary data strobe signal DQS_c through the second strobe pad 513. The strobe buffer 515 may amplify a level difference between the data strobe signal DQS_t and the complementary data strobe signal DQS_c to generate and output the internal data strobe signal IDQS.

Figure 5:
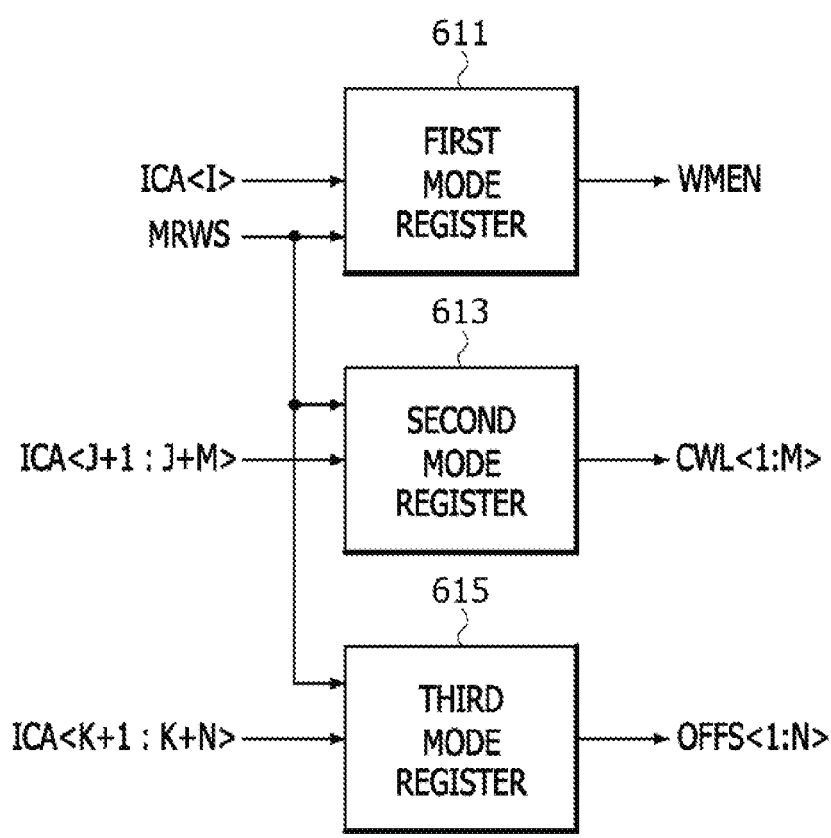
FIG. 5 is a block diagram illustrating an example of a mode register circuit included in the semiconductor system of FIG. 2.

Referring to FIG. 5, the mode register circuit 323 may include a first mode register 611, a second mode register 613 and a third mode register 615. The first mode register 611 may store an $I^{th}$ internal control signal ICA<I> of the internal control signal ICA<1:L> based on the mode register write signal MRWS to output the stored signal of the $I^{th}$ internal control signal ICA<I> as the training mode selection signal WMEN. The number "I" of the $I^{th}$ internal control signal ICA<I>, for generating the training mode selection signal WMEN, may be different according to the embodiments. The second mode register 613 may store $(J+1)^{th}$ to $(J+M)^{th}$ internal control signals ICA<J+1:J+M> of the internal control signal ICA<1:L> based on the mode register write signal MRWS to output the stored signals of the $(J+1)^{th}$ to $(J+M)^{th}$ internal control signals ICA<J+1:J+M> as the latency code CWL<1:M>. The number "J" of the $(J+1)^{th}$ to $(J+M)^{th}$ internal control signals ICA<J+1:J+M> for generating the latency code CWL<1:M> may be different according to the embodiments. The third mode register 615 may store $(K+1)^{th}$ to $(K+N)^{th}$ internal control signals ICA<K+1:K+N> of the internal control signal ICA<1:L> based on the mode register write signal MRWS to output the stored signals of the $(K+1)^{th}$ to $(K+N)^{th}$ internal control signals ICA<K+1:K+N> as the offset code OFFS<1:N>. The number "K" of the $(K+1)^{th}$ to $(K+N)^{th}$ internal control signals ICA<K+1:K+N>, for generating the offset code OFFS<1:N>, may be different according to the embodiments.

Figure 6:
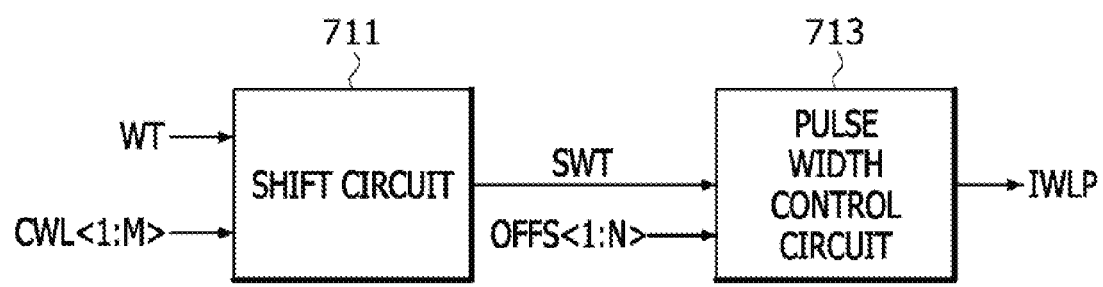
FIG. 6 is a block diagram illustrating an example of an internal command pulse generation circuit included in the semiconductor system of FIG. 2.

Referring to FIG. 6, the internal command pulse generation circuit 325 may include a shift circuit 711 and a pulse width control circuit 713. The shift circuit 711 may shift the write signal WT by a predetermined period, which is set by the latency code CWL<1:M>, to generate the shifted write signal SWT. The latency code CWL<1:M> may have a logic level combination corresponding to the write latency period. For example, the shift circuit 711 may shift the write signal WT by a first shift period to output the shifted signal of the write signal WT as the shifted write signal SWT when the latency code CWL<1:M> has a third logic level combination. Furthermore, the shift circuit 711 may shift the write signal WT by a second shift period to output the shifted signal of the write signal WT as the shifted write signal SWT when the latency code CWL<1:M> has a fourth logic level combination. The pulse width control circuit 713 may adjust a pulse width of the shifted write signal SWT according to the offset code OFFS<1:N> to generate the internal command pulse IWLP. For example, the pulse width control circuit 713 may generate and output the internal command pulse IWLP having the same pulse width as the shifted write signal SWT when the offset code OFFS<1:N> has a fifth logic level combination which is initialized. Furthermore, the pulse width control circuit 713 may generate and output the internal command pulse IWLP having a pulse width which is greater than a pulse width of the shifted write signal SWT when the offset code OFFS<1:N> has a sixth logic level combination. Additionally, the pulse width control circuit 713 may generate the internal command pulse IWLP having a pulse width which is less than a pulse width of the shifted write signal SWT according to a logic level combination of the offset code OFFS<1:N>. The third to sixth logic level combinations may be different according to the embodiments.

Figure 7:
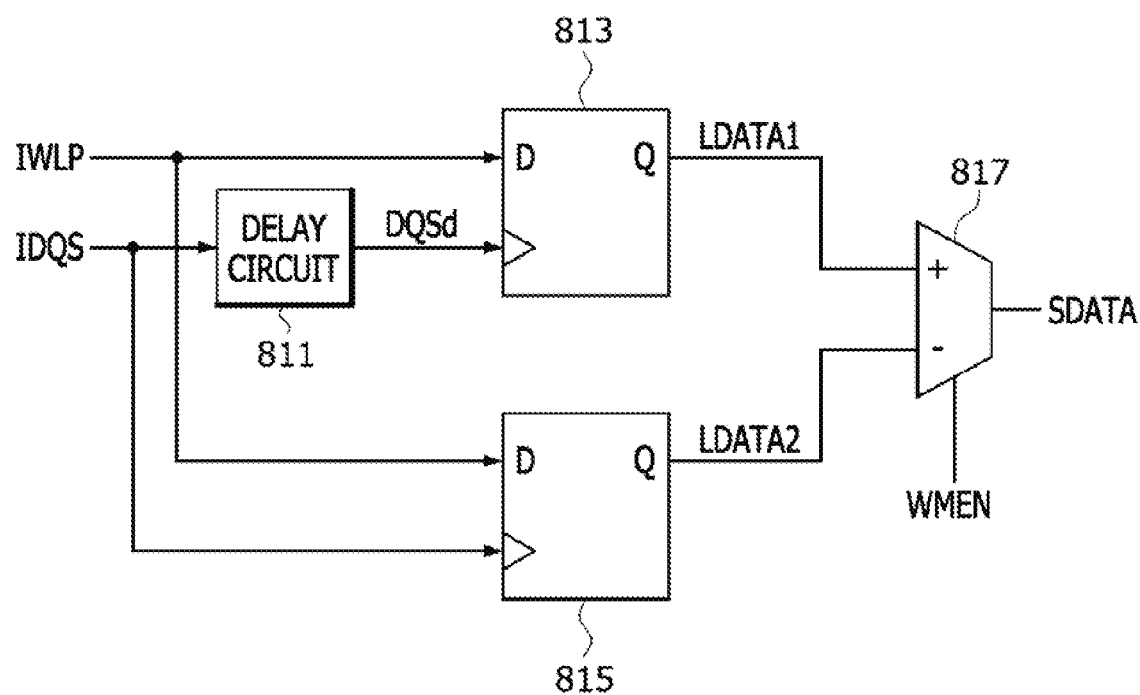
FIG. 7 is a circuit diagram illustrating an example of a sense data generation circuit included in the semiconductor system of FIG. 2.

Referring to FIG. 7, the sense data generation circuit 327 may include a delay circuit 811, a first latched data generation circuit 813, a second latched data generation circuit 815, and a data selection circuit 817. The delay circuit 811 may delay the internal data strobe signal IDQS to generate a delayed strobe signal DQSd. The first latched data generation circuit 813 may be synchronized with the delayed strobe signal DQSd to latch the internal command pulse IWLP and to output the latched pulse of the internal command pulse IWLP as first latched data LDATA1. The second latched data generation circuit 815 may be synchronized with the internal data strobe signal IDQS to latch the internal command pulse IWLP and to output the latched pulse of the internal command pulse IWLP as second latched data LDATA2. The data selection circuit 817 may output the first latched data LDATA1 or the second latched data LDATA2 as the sense data SDATA based on the training mode selection signal WMEN. For example, the data selection circuit 817 may output the first latched data LDATA1 as the sense data SDATA according to the training mode selection signal WMEN having a logic "high" level in the external write leveling training mode. On the other hand, the data selection circuit 817 may output the second latched data LDATA2 as the sense data SDATA according to the training mode selection signal WMEN having a logic "low" level in the internal write leveling training mode.

Figure 8:
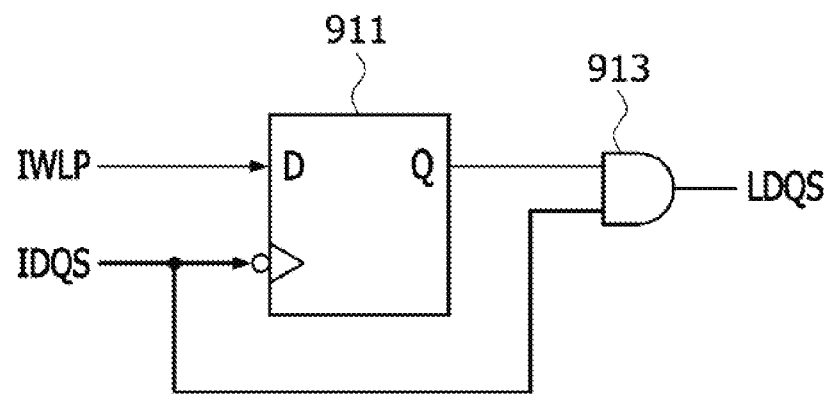
FIG. 8 is a circuit diagram illustrating an example of a strobe signal latch circuit included in the semiconductor system of FIG. 2.

Referring to FIG. 8, the strobe signal latch circuit 331 may include a pulse latch circuit 911 and a latched strobe signal output circuit 913. The pulse latch circuit 911 may latch the internal command pulse IWLP to output the latched pulse of the internal command pulse IWLP when the internal data strobe signal IDQS having a logic "low" level is inputted to the pulse latch circuit 911. The latched strobe signal output circuit 913 may perform a logical AND operation, based on the internal data strobe signal IDQS and an output signal of the pulse latch circuit 911, to generate the latched data strobe signal LDQS. The latched strobe signal output circuit 913 may buffer an output signal of the pulse latch circuit 911 and output the buffered output signal of the pulse latch circuit 911 as the latched data strobe signal LDQS when the internal data strobe signal IDQS has a logic "high" level. The strobe signal latch circuit 331 may latch the internal command pulse IWLP and may output the latched pulse of the internal command pulse IWLP as the latched data strobe signal LDQS, when a falling edge and a rising edge of the internal data strobe signal IDQS are sequentially inputted to the strobe signal latch circuit 331.

Figure 9:
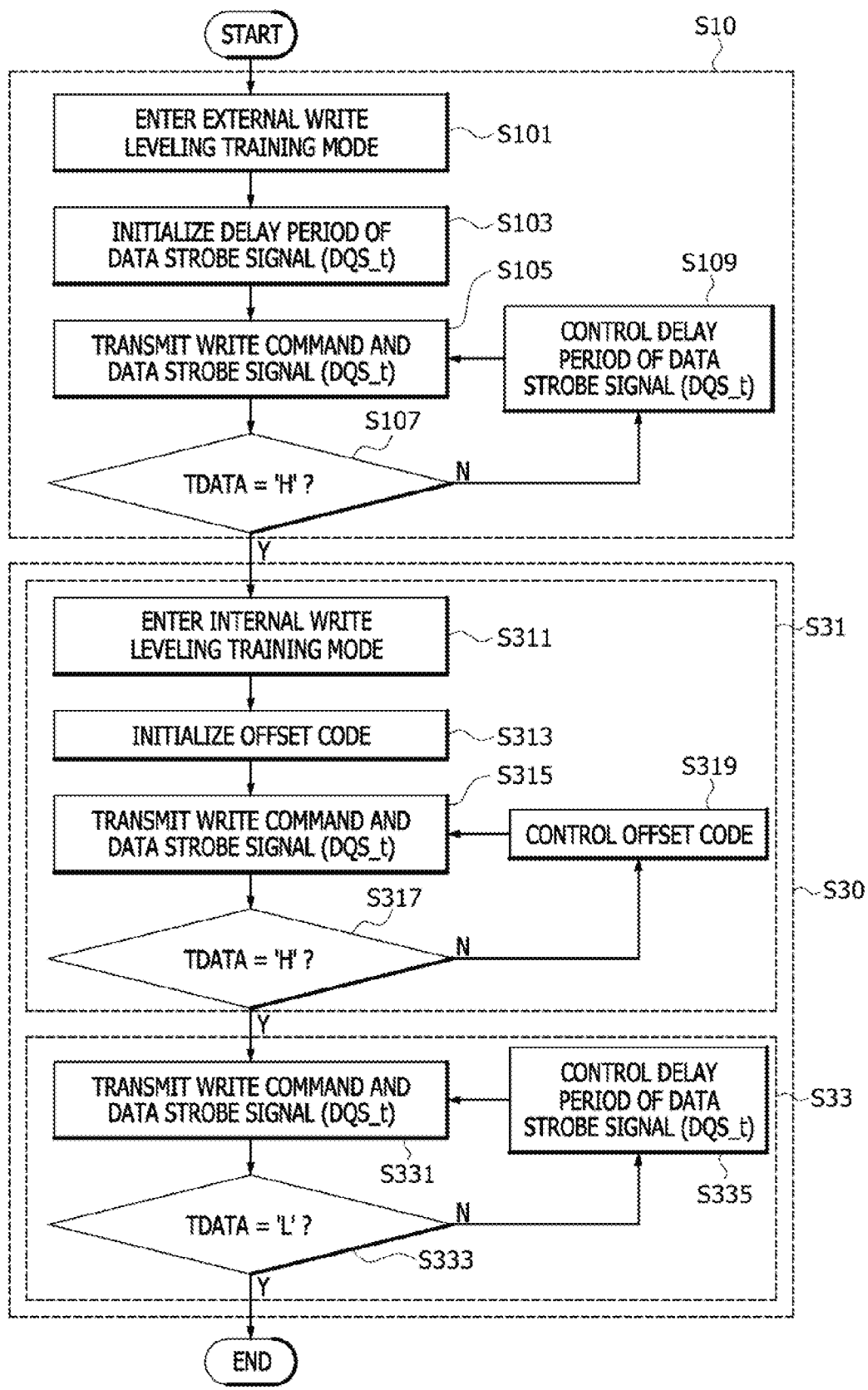
FIG. 9 is a flowchart illustrating an example of a write leveling operation of the semiconductor system shown in FIG. 2.

Referring to FIG. 9, a write leveling operation of the semiconductor system 100 may include an external write leveling training operation S10 and an internal write leveling training operation S30.

The external write leveling training operation S10 will now be described in detail.

When the mode register write operation is performed and the training mode selection signal WMEN having a logic "high" level is generated from the internal control signal ICA<1:L>, the external write leveling training mode may be activated (step S101). The controller 1 may initialize a delay period of the data strobe signal DQS_t (step S103) and may transmit a write command and the data strobe signal DQS_t to the semiconductor device 3 (step S105). The write command may be applied to the semiconductor device 3 by transmitting the control signal CA<1:L> to generate the write signal WT from the controller 1 to the semiconductor device 3. The semiconductor device 3 may perform the write operation in synchronization with the data strobe signal DQS_t to generate the transmission data TDATA. The controller 1 may receive the transmission data TDATA from the semiconductor device 3 to discriminate the logic level of the transmission data TDATA (step S107). The controller 1 may control a delay period of the data strobe signal DQS_t when the transmission data TDATA has a logic "low" level (step S109). Steps S105, S107, and S109 may be iteratively and sequentially performed until the transmission data TDATA has a logic "high" level. When the transmission data TDATA has a logic "high" level, the controller 1 may stop an operation of controlling a delay period of the data strobe signal DQS_t to terminate the external write leveling training operation S10. After the external write leveling training operation S10 terminates, the controller 1 may transmit information on the write latency period in which the delay period of the data strobe signal DQS_t is reflected to the semiconductor device 3 through the control signal CA<1:L>, thereby setting a logic level combination of the latency code CWL<1:M> which is used to generate the internal command pulse IWLP.

The internal write leveling training operation S30 may include a first internal write leveling training operation S31 and a second internal write leveling training operation S33, which will now be described in detail.

When the mode register write operation is performed and the training mode selection signal WMEN having a logic "low" level is generated from the internal control signal ICA<1:L>, the internal write leveling training mode may be activated (step S311). The controller 1 may initialize the offset code OFFS<1:N>, used in the generation of the internal command pulse IWLP in the semiconductor device 3, by transmitting the control signal CA<1:L> to the semiconductor device 3 during the mode register write operation (step S313). The controller 1 may transmit the write command and the data strobe signal DQS_t to the semiconductor device 3 (step S315). The semiconductor device 3 may perform the write operation in synchronization with the data strobe signal DQS_t to generate the transmission data TDATA. The controller 1 may receive the transmission data TDATA from the semiconductor device 3 to discriminate the logic level of the transmission data TDATA (step S317). The controller 1 may control the offset code OFFS<1:N> when the transmission data TDATA has a logic "low" level (step S319). Steps S315, S317, and S319 may be iteratively and sequentially performed until the transmission data TDATA has a logic "high" level. When the transmission data TDATA has a logic "high" level, the semiconductor device 3 may stop an operation of controlling the offset code OFFS<1:N> to terminate the first internal write leveling training operation S31.

The controller 1 may transmit the write command and the data strobe signal DQS_t to the semiconductor device 3 (step S331). The semiconductor device 3 may perform the write operation in synchronization with the data strobe signal DQS_t to generate the transmission data TDATA. The controller 1 may receive the transmission data TDATA from the semiconductor device 3 to discriminate the logic level of the transmission data TDATA (step S333). The controller 1 may control a delay period of the data strobe signal DQS_t when the transmission data TDATA has a logic "high" level (step S335). Steps S331, S333, and S335 may be iteratively and sequentially performed until the transmission data TDATA has a logic "low" level. When the transmission data TDATA has a logic "low" level, the controller 1 may stop an operation of controlling a delay period of the data strobe signal DQS_t to terminate the second internal write leveling training operation S33.

Figure 10:
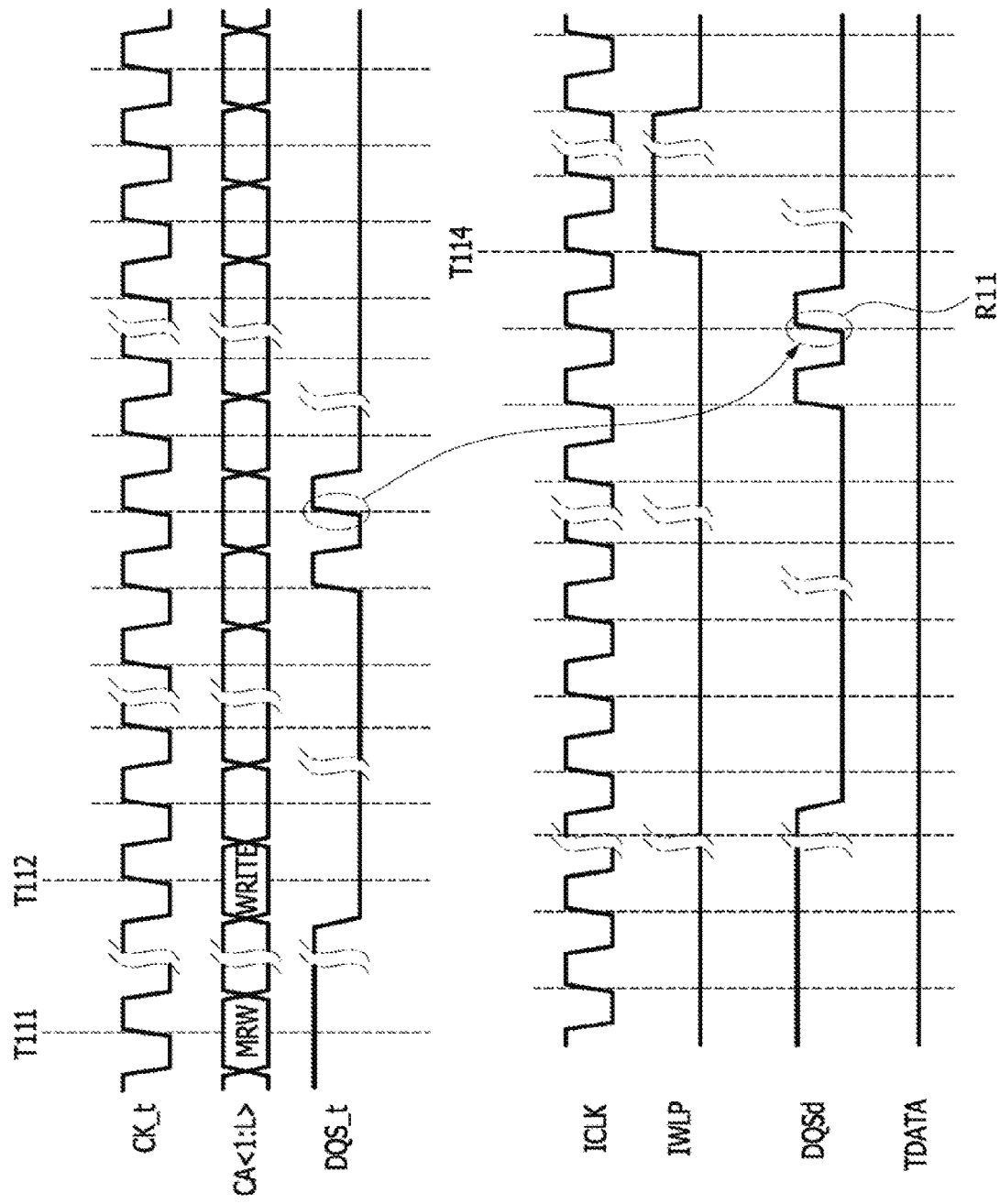
FIGS. 10 to 15 are timing diagrams illustrating in detail the write leveling operation shown in FIG. 9.
Figure 11:
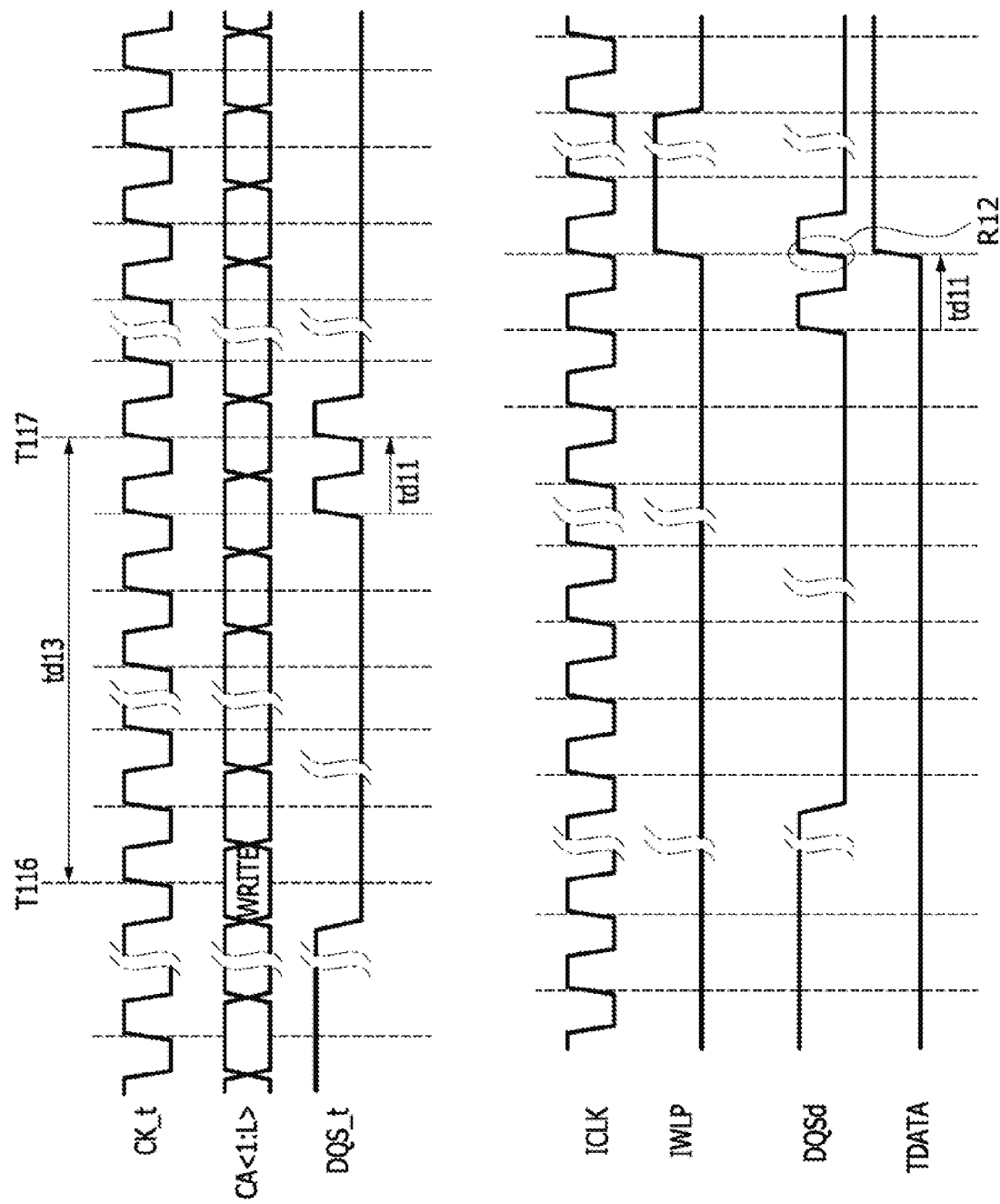

FIGS. 10 and 11 illustrate the external write leveling training operation S10 of FIG. 9 in detail.

As illustrated in FIG. 10, the controller 1 may perform a mode register write operation MRW at a point in time "T111" of the clock signal CK_t and may transmit the control signal CA<1:L> to the semiconductor device 3 to activate the external write leveling training mode. The controller 1 may transmit the control signal CA<1:L> to the semiconductor device 3 to perform a write operation WRITE at a point in time "T112" of the clock signal CK_t. The controller 1 may transmit the data strobe signal DQS_t, a delay period of which is initialized, to the semiconductor device 3. The semiconductor device 3 may generate the internal command pulse IWLP at a point in time "T114" of the clock signal CK_t. The semiconductor device 3 may delay the data strobe signal DQS_t to generate the delayed strobe signal DQSd. The semiconductor device 3 may latch the internal command pulse IWLP in synchronization with a rising edge R11 of the delayed strobe signal DQSd to generate the transmission data TDATA having a logic "low" level. When the transmission data TDATA has a logic "low" level, the controller 1 may iteratively and sequentially perform an operation of controlling a delay period of the data strobe signal DQS_t and an operation of generating the transmission data TDATA according to the write operation. When the transmission data TDATA is generated, an edge of the delayed strobe signal DQSd, for latching the internal command pulse IWLP, may be different according to the embodiments.

As illustrated in FIG. 11, the controller 1 may transmit the control signal CA<1:L> to the semiconductor device 3 at a point in time "T116" of the clock signal CK_t to perform the write operation WRITE. The controller 1 may transmit the data strobe signal DQS_t, which is delayed by a time "td11", to the semiconductor device 3. The semiconductor device 3 may latch the internal command pulse IWLP in synchronization with a rising edge R12 of the delayed strobe signal DQSd, which is delayed by the time "td11", to generate the transmission data TDATA having a logic "high" level. The controller 1 may receive the transmission data TDATA to set a period "td13" from the point in time "T116," when the write command is applied to the semiconductor device 3, till a point in time "T117," the period "td13" being a write latency period.

The semiconductor system 100, according to an embodiment, may control a delay period of the data strobe signal DQS_t, through the external write leveling training operation (S10 of FIG. 9), to align the delayed strobe signal DQSd with the internal command pulse IWLP. Thus, the controller 1 may extract information on the write latency period and may store the information on the write latency period into the semiconductor device 3.

Figure 12:
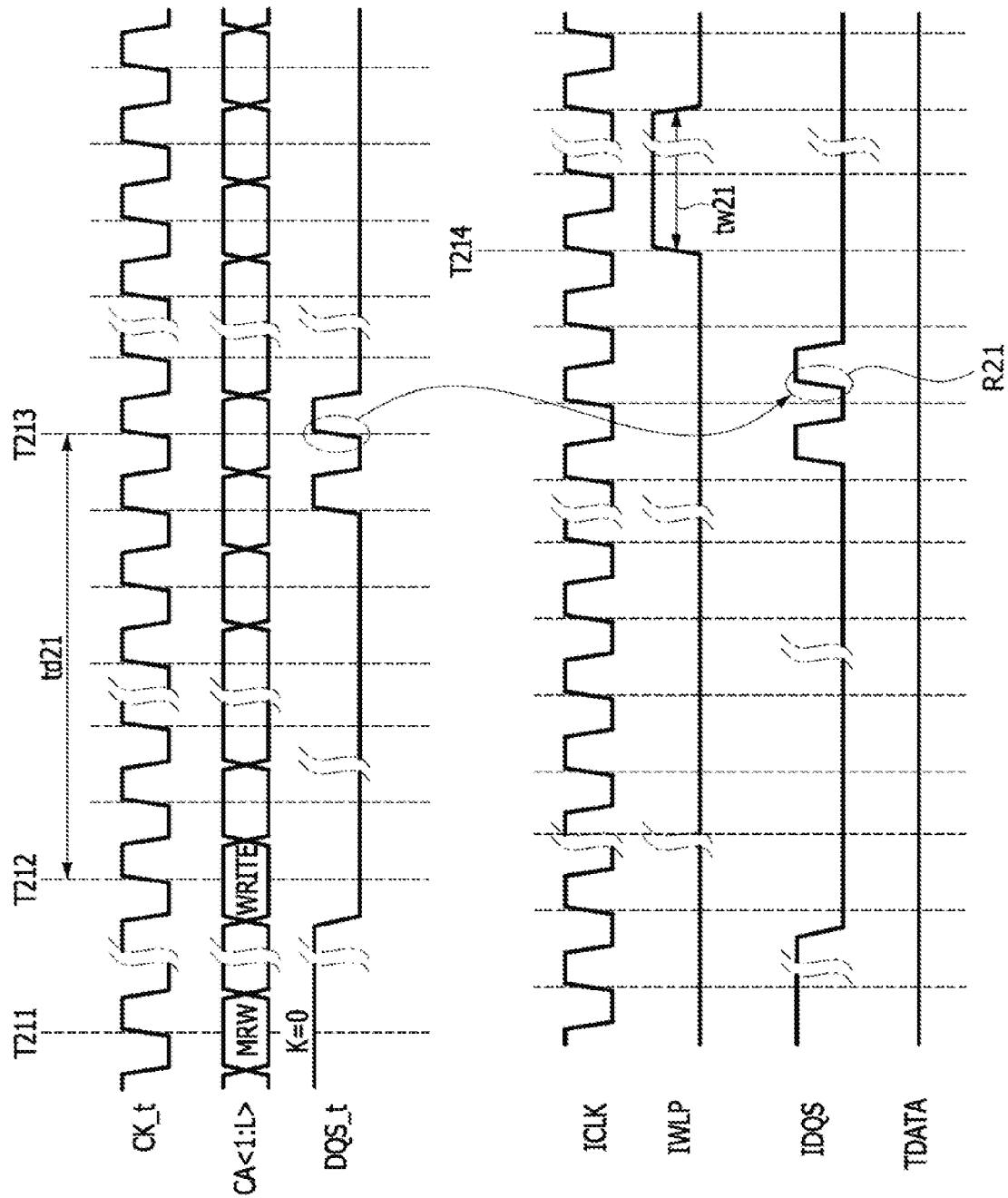
Figure 13:
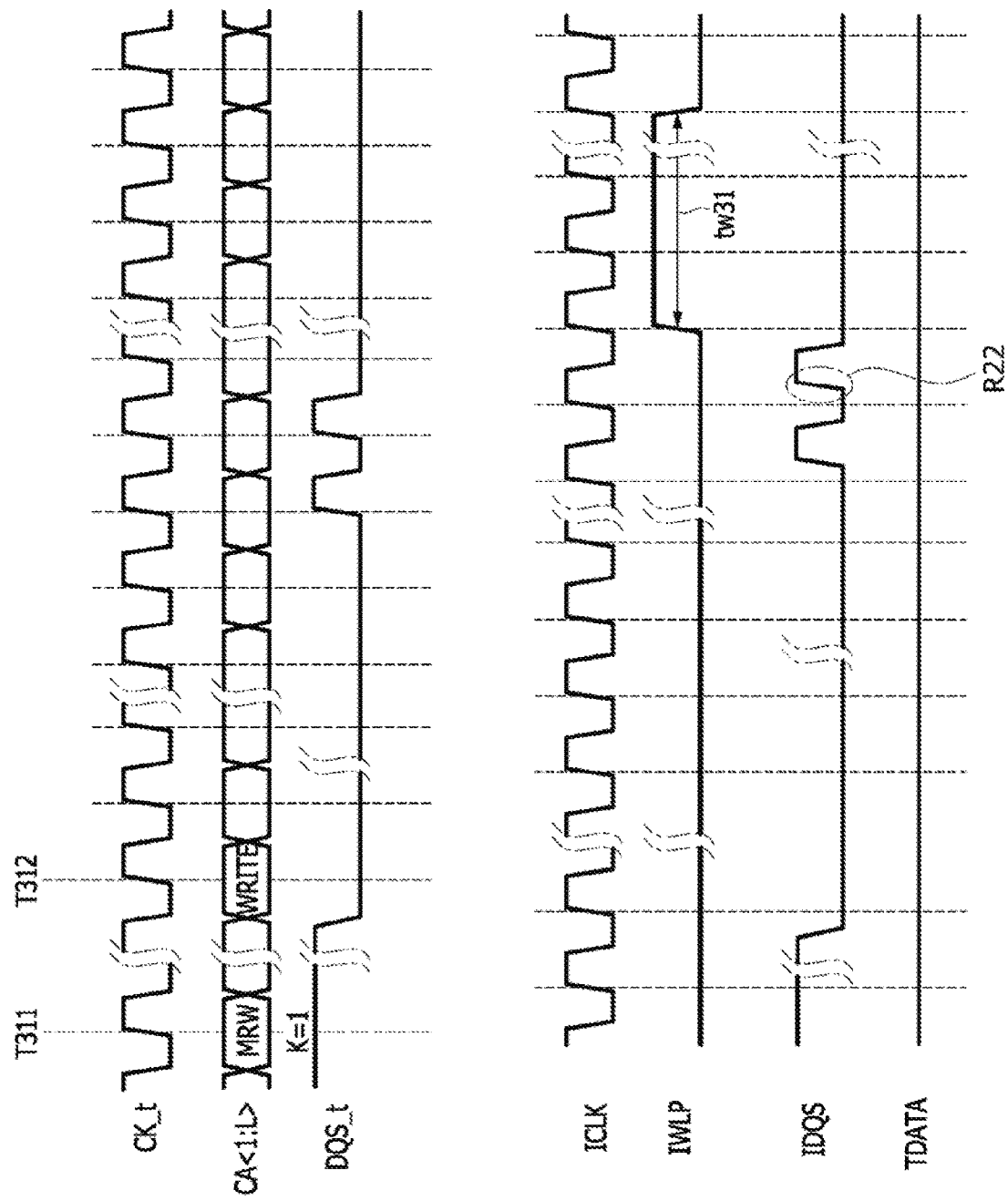
Figure 14:
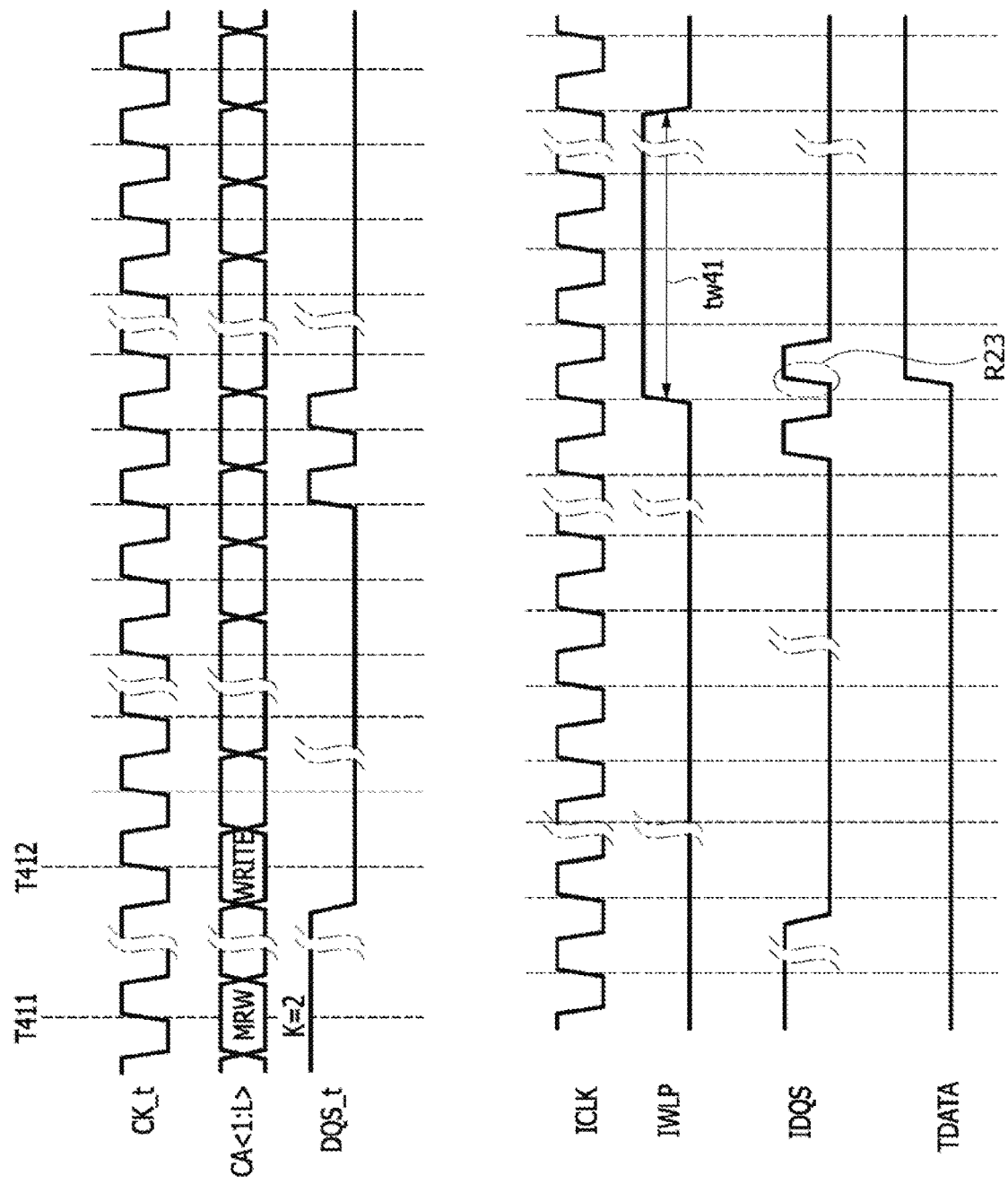

FIGS. 12 to 14 illustrate the first internal write leveling training operation S31 of FIG. 9 in detail.

As illustrated in FIG. 12, the controller 1 may perform the mode register write operation MRW at a point in time "T211" of the clock signal CK_t and may transmit the control signal CA<1:L> to the semiconductor device 3 to activate the internal write leveling training mode and the control signal CA<1:L> for initializing the offset code OFFS<1:N>. In FIG. 12, "K=0" means a status that the offset code OFFS<1:N> is initialized. The controller 1 may transmit the control signal CA<1:L> to the semiconductor device 3 to perform the write operation WRITE at a point in time "T212" of the clock signal CK_t. The controller 1 may transmit the data strobe signal DQS_t to the semiconductor device 3 using a point in time "T213" when a time "td21", which is set as the write latency period in the external write leveling training mode, elapses from the point in time "T212" of the clock signal CK_t as a reference point in time. The semiconductor device 3 may generate the internal command pulse IWLP based on the write signal WT at a point in time "T214" of the clock signal CK_t. The internal command pulse IWLP may be generated to have a pulse width of 'tw21' by the initialized offset code OFFS<1:N>. The semiconductor device 3 may latch the internal command pulse IWLP in synchronization with a rising edge R21 of the internal data strobe signal IDQS to generate the transmission data TDATA having a logic "low" level. When the transmission data TDATA is generated, an edge of the internal data strobe signal IDQS, for latching the internal command pulse IWLP, may be different according to the embodiments.

As illustrated in FIG. 13, the controller 1 may perform the mode register write operation MRW at a point in time "T311" of the clock signal CK_t and may transmit the control signal CA<1:L> to the semiconductor device 3 to set the offset code OFFS<1:N>, controlled according to the transmission data TDATA having a logic "low" level. In FIG. 13, "K=1" means a status that the offset code OFFS<1: N> is controlled once. The controller 1 may transmit the control signal CA<1:L> to the semiconductor device 3 to perform the write operation WRITE at a point in time "T312" of the clock signal CK_t. The semiconductor device 3 may generate the internal command pulse IWLP, whose pulse width is controlled to have a time of 'tw31' by the offset code OFFS<1:N>. The semiconductor device 3 may latch the internal command pulse IWLP in synchronization with a rising edge R22 of the internal data strobe signal IDQS to generate the transmission data TDATA having a logic "low" level.

As illustrated in FIG. 14, the controller 1 may perform the mode register write operation MRW at a point in time "T411" of the clock signal CK_t and may transmit the control signal CA<1:L> to the semiconductor device 3 to set the offset code OFFS<1:N>, controlled according to the transmission data TDATA having a logic "low" level. In FIG. 14, "K=2" means a status that the offset code OFFS<1:N> is controlled twice. The controller 1 may transmit the control signal CA<1:L> to the semiconductor device 3 to perform the write operation WRITE at a point in time "T412" of the clock signal CK_t. The semiconductor device 3 may generate the internal command pulse IWLP, whose pulse width is controlled to have a time of 'tw41' by the offset code OFFS<1:N>. The semiconductor device 3 may latch the internal command pulse IWLP in synchronization with a rising edge R23 of the internal data strobe signal IDQS to generate the transmission data TDATA having a logic "high" level. When the transmission data TDATA has a logic "high" level, the semiconductor device 3 may terminate the first internal write leveling training operation S31.

The semiconductor system 100, according to an embodiment, may adjust a pulse width of the internal command pulse IWLP, according to the offset code OFFS<1:N>, through the first internal write leveling training operation (S31 of FIG. 9), to align the internal data strobe signal IDQS with the internal command pulse IWLP.

Figure 15:
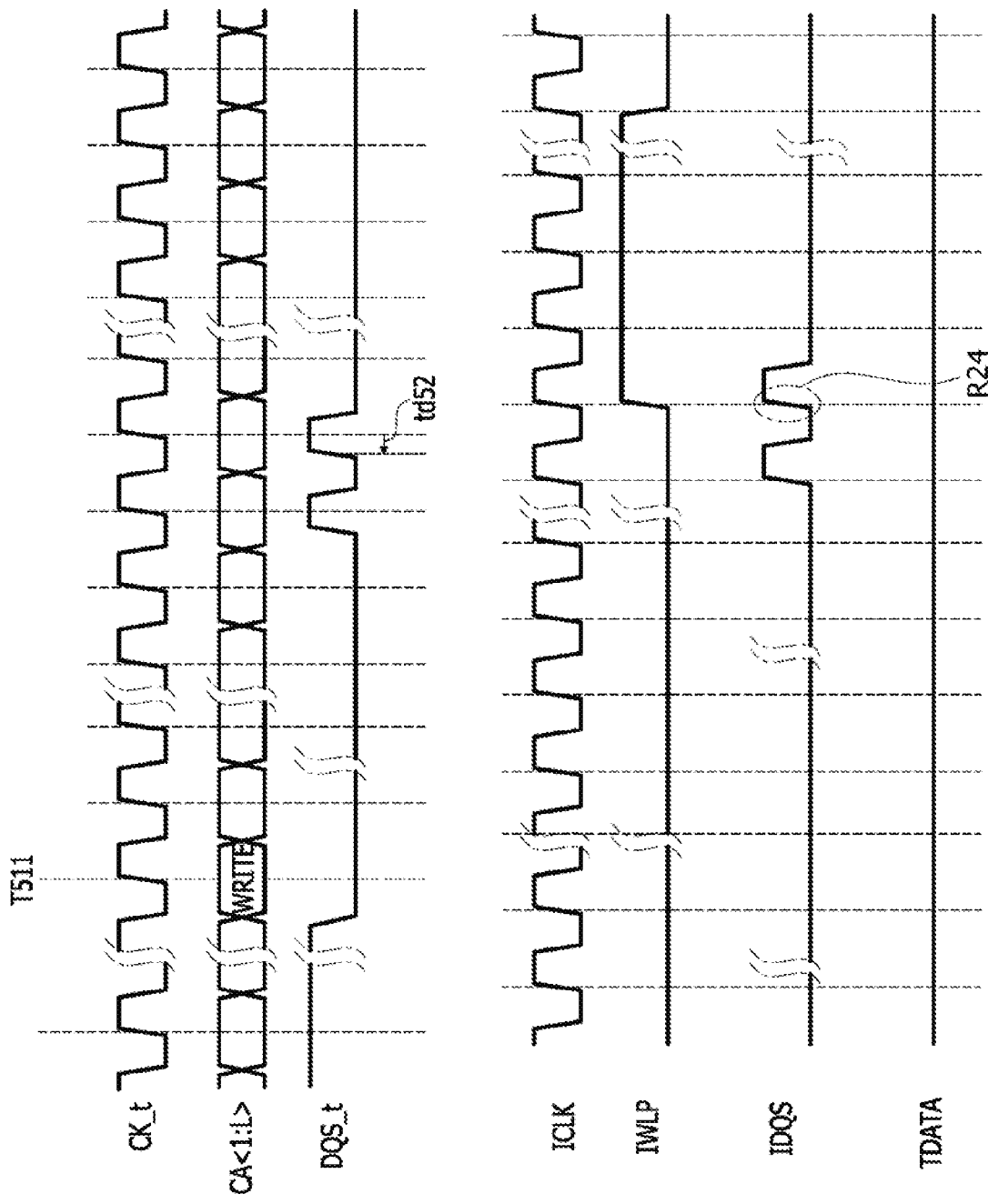

As illustrated in FIG. 15, the controller 1 may transmit the control signal CA<1:L> to the semiconductor device 3 to perform the write operation WRITE at a point in time "T511" of the clock signal CK_t. The controller 1 may transmit the data strobe signal DQS_t to the semiconductor device 3. The semiconductor device 3 may latch the internal command pulse IWLP in synchronization with a rising edge R24 of the internal data strobe signal IDQS to generate the transmission data TDATA. When the transmission data TDATA has a logic "high" level, the controller 1 may iteratively and sequentially perform an operation of controlling a delay period of the data strobe signal DQS_t and an operation of generating the transmission data TDATA according to the write operation. The controller 1 may iteratively and sequentially perform the operation of controlling a delay period of the data strobe signal DQS_t and the operation of generating the transmission data TDATA until the transmission data TDATA has a logic "low" level. When a delay period of the data strobe signal DQS_t, transmitted from the controller 1 to the semiconductor device 3, is controlled by a negative period 'td52', the second internal write leveling training operation (S33 of FIG. 9) may terminate because the transmission data TDATA is generated to have a logic "low" level.

The semiconductor system 100, according to an embodiment, may control a delay period of the data strobe signal DQS_t, through the second internal write leveling training operation (S33 of FIG. 9), to more accurately align the internal data strobe signal IDQS with the internal command pulse IWLP.

Figure 16:
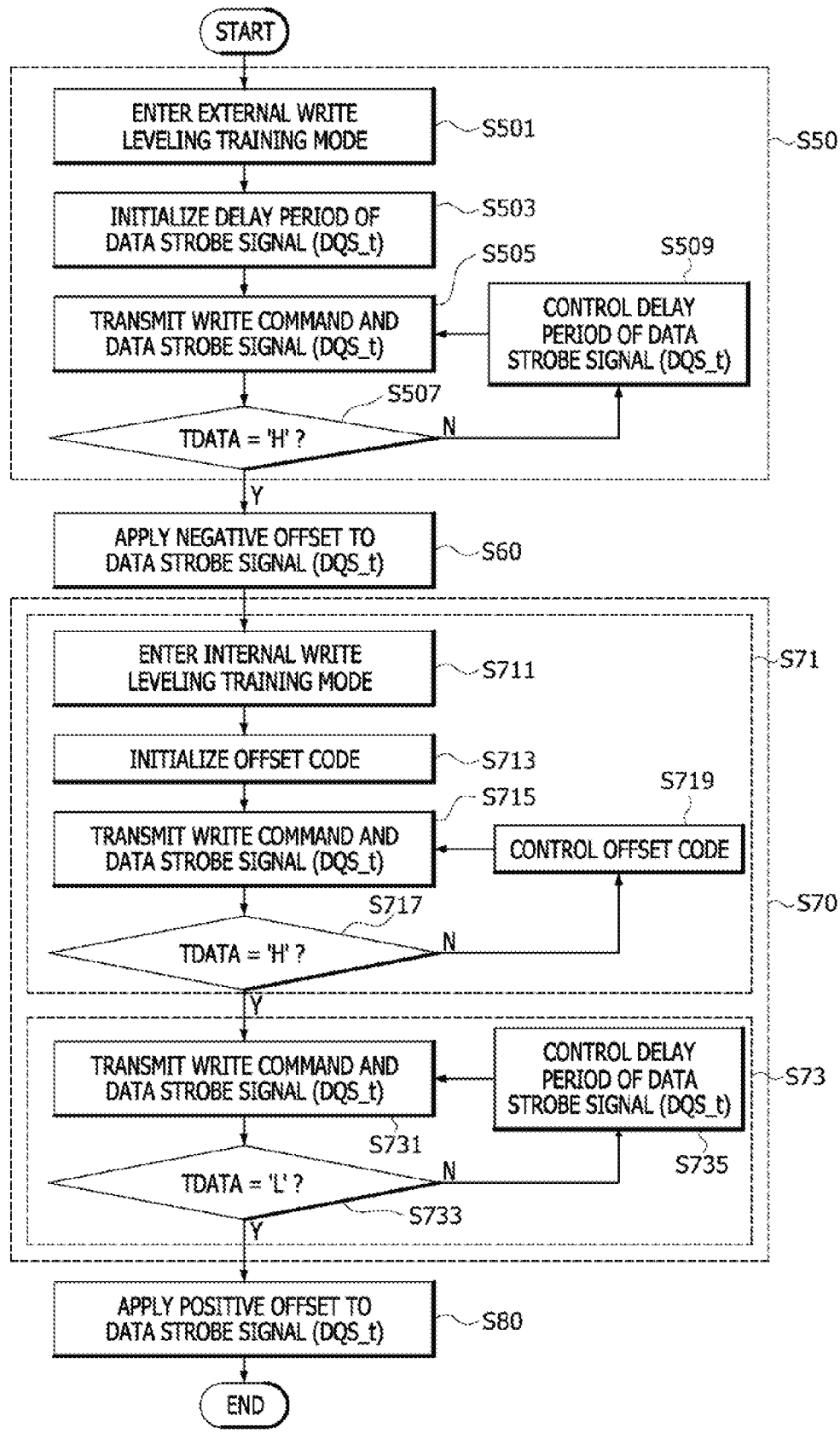
FIG. 16 is a flowchart illustrating another example of a write leveling operation of the semiconductor system shown in FIG. 2.

Referring to FIG. 16, a write leveling operation of the semiconductor system 100 may include an external write leveling training operation S50, an operation S60 of applying a negative offset to the data strobe signal DQS_t, an internal write leveling training operation S70, and an operation S80 of applying a positive offset to the data strobe signal DQS_t.

The external write leveling training operation S50 will now be described in detail.

When the mode register write operation MRW is performed and the training mode selection signal WMEN, having a logic "high" level, is generated from the internal control signal ICA<1:L>, the external write leveling training mode may be activated (step S501). The controller 1 may initialize a delay period of the data strobe signal DQS_t (step S503) and may transmit the write command and the data strobe signal DQS_t to the semiconductor device 3 (step S505).

The semiconductor device 3 may perform the write operation in synchronization with the data strobe signal DQS_t to generate the transmission data TDATA. The controller 1 may receive the transmission data TDATA from the semiconductor device 3 to discriminate the logic level of the transmission data TDATA (step S507). The controller 1 may control a delay period of the data strobe signal DQS_t when the transmission data TDATA has a logic "low" level (step S509). Steps S505, S507, and S509 may be iteratively and sequentially performed until the transmission data TDATA has a logic "high" level. When the transmission data TDATA has a logic "high" level, the controller 1 may stop an operation of controlling a delay period of the data strobe signal DQS_t to terminate the external write leveling training operation S50. After the external write leveling training operation S50 terminates, the controller 1 may transmit information on the write latency period in which the delay period of the data strobe signal DQS_t is reflected to the semiconductor device 3 through the control signal CA<1:L>, thereby setting a logic level combination of the latency code CWL<1:M> which is used to generate the internal command pulse IWLP.

The controller 1 may apply a negative offset to the data strobe signal DQS_t and may transmit the data strobe signal DQS_t, thereby applying the negative offset to the semiconductor device 3 (step S60). The reason why the negative offset is applied to the data strobe signal DQS_t in the controller 1 is to obtain the data strobe signal DQS_t, toggled at around a point in time when the write latency period elapses from a point in time when the write command is applied to the semiconductor device 3, even though a positive offset is applied to the data strobe signal DQS_t in the controller 1.

The internal write leveling training operation S70 may include a first internal write leveling training operation S71 and a second internal write leveling training operation S73, which will now be described in detail.

When the mode register write operation MRW is performed and the training mode selection signal WMEN, having a logic "low" level, is generated from the internal control signal ICA<1:L>, the internal write leveling training mode may be activated (step S711). The controller 1 may initialize the offset code OFFS<1:N>, used in generation of the internal command pulse IWLP in the semiconductor device 3, by transmitting the control signal CA<1:L> to the semiconductor device 3 during the mode register write operation (step S713). The controller 1 may transmit the write command and the data strobe signal DQS_t to the semiconductor device 3 (step S715). The semiconductor device 3 may perform the write operation in synchronization with the data strobe signal DQS_t to generate the transmission data TDATA. The controller 1 may receive the transmission data TDATA from the semiconductor device 3 to discriminate the logic level of the transmission data TDATA (step S717). The controller 1 may control the offset code OFFS<1:N> when the transmission data TDATA has a logic "low" level (step S719). Steps S715, S717, and S719 may be iteratively and sequentially performed until the transmission data TDATA has a logic "high" level. When the transmission data TDATA has a logic "high" level, the semiconductor device 3 may stop an operation of controlling the offset code OFFS<1:N> to terminate the first internal write leveling training operation S71.

The controller 1 may transmit the write command and the data strobe signal DQS_t to the semiconductor device 3 (step S731). The semiconductor device 3 may perform the write operation in synchronization with the data strobe signal DQS_t to generate the transmission data TDATA. The controller 1 may receive the transmission data TDATA from the semiconductor device 3 to discriminate the logic level of the transmission data TDATA (step S733). The controller 1 may control a delay period of the data strobe signal DQS_t when the transmission data TDATA has a logic "high" level (step S735). Steps S731, S733, and S735 may be iteratively and sequentially performed until the transmission data TDATA has a logic "low" level. When the transmission data TDATA has a logic "low" level, the controller 1 may stop an operation of controlling a delay period of the data strobe signal DQS_t to terminate the second internal write leveling training operation S73.

The controller 1 may apply a positive offset to the data strobe signal DQS_t and may transmit the data strobe signal DQS_t, to which the positive offset is applied, to the semiconductor device 3 (step S80). The reason why the positive offset is applied to the data strobe signal DQS_t in the controller 1 is to obtain the internal command pulse IWLP, stably latched and inputted by the data strobe signal DQS_t, that is toggling by delaying a toggling point in time of the data strobe signal DQS_t on the basis of a point in time, when the internal command pulse IWLP is generated.

Figure 17:
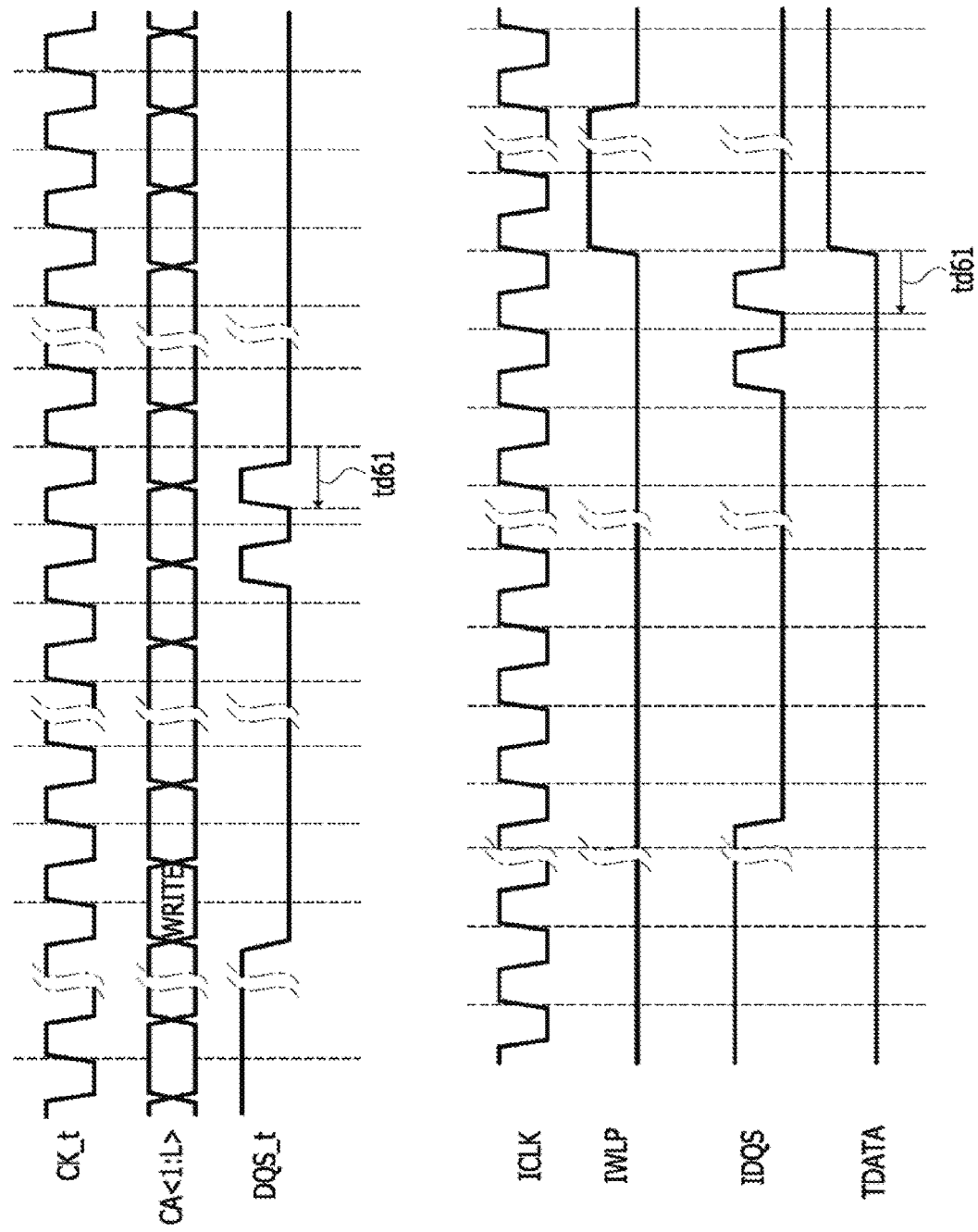
FIGS. 17 to 21 are timing diagrams illustrating in detail the write leveling operation shown in FIG. 16.

FIG. 17 specifically illustrates the step (S60 of FIG. 16) for applying the negative offset to the data strobe signal DQS_t in the controller 1 to transmit the data strobe signal DQS_t, thereby applying the negative offset to the semiconductor device 3. The negative offset, which is set to be a time 'td61', may be applied to the data strobe signal DQS_t whose delay period is controlled through the external write leveling training operation S50. The negative offset, which is set to be the time 'td61', may also be reflected in the internal data strobe signal IDQS generated from the data strobe signal DQS_t. In the present embodiment, the negative offset may be a time of "−0.75×tCK", and this may correspond to a case that a preamble period tWPRE of the data strobe signal DQS_t is set to be a time of "2×tCK". Various negative offsets, which are set according to the preamble period tWPRE of the data strobe signal DQS_t, will be described with reference to FIG. 22.

Figure 18:
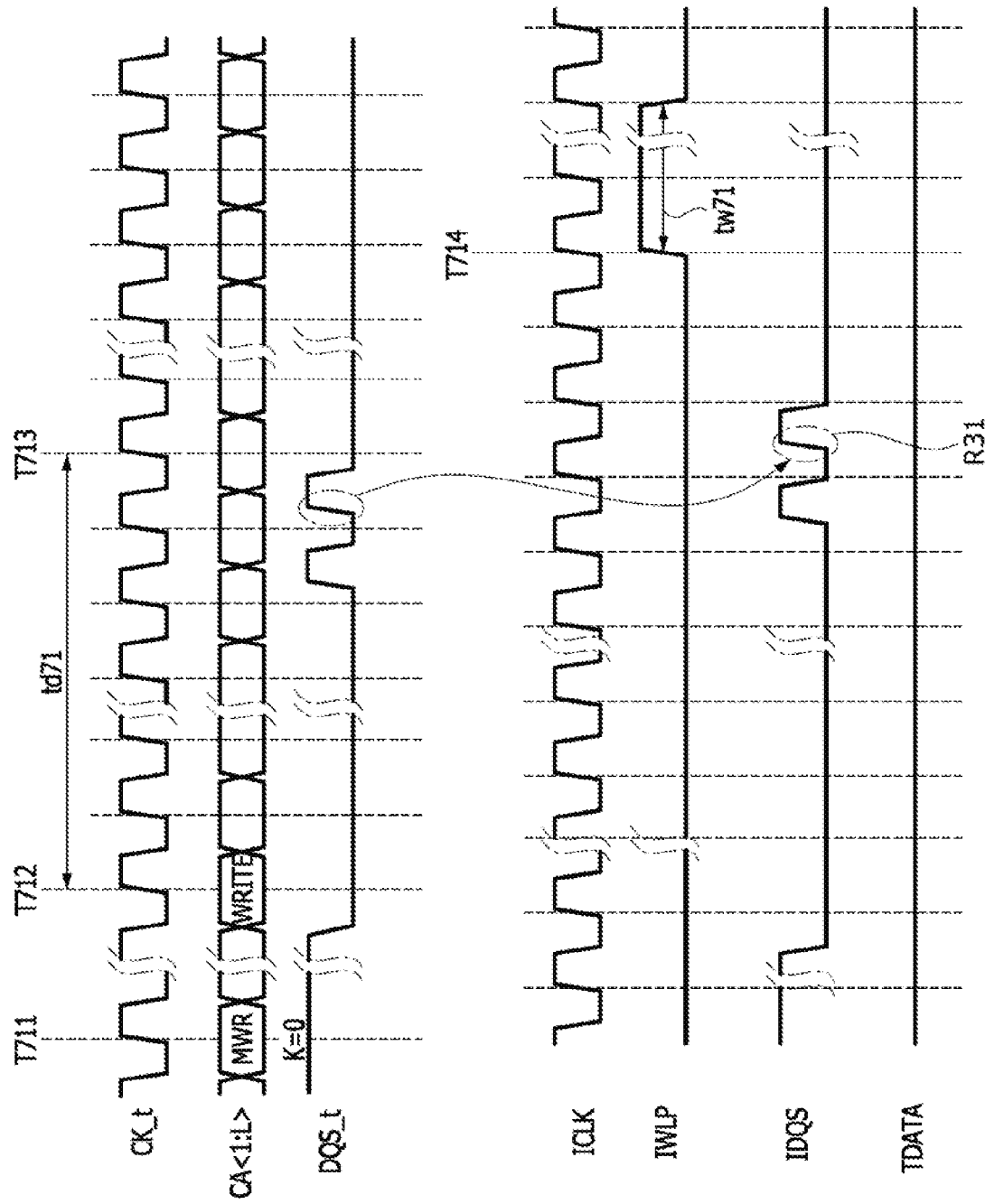
Figure 19:
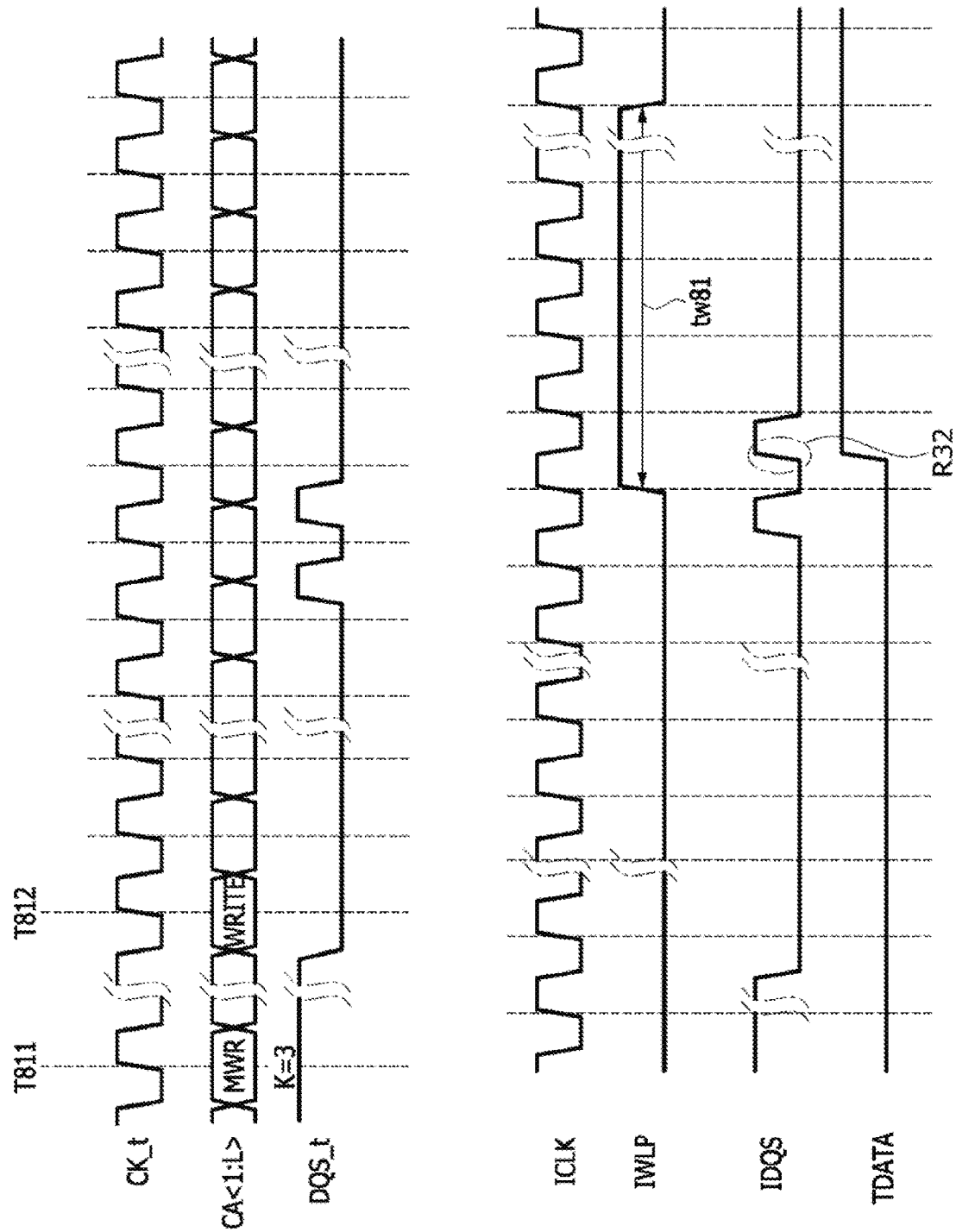

FIGS. 18 and 19 illustrate the first internal write leveling training operation S71 of FIG. 16 in detail.

As illustrated in FIG. 18, the controller 1 may perform the mode register write operation MRW at a point in time "T711" of the clock signal CK_t and may transmit the control signal CA<1:L> to the semiconductor device 3 to activate the internal write leveling training mode and to initialize the offset code OFFS<1:N>. In FIG. 18, "K=0" means a status that the offset code OFFS<1:N> is initialized. The controller 1 may transmit the control signal CA<1:L> to the semiconductor device 3 to perform the write operation WRITE at a point in time "T712" of the clock signal CK_t. The controller 1 may transmit the data strobe signal DQS_t to the semiconductor device 3 using a point in time "T713" when a time "td71", which is set as the write latency period in the external write leveling training mode, elapses from the point in time "T712" of the clock signal CK_t as a reference point in time. The semiconductor device 3 may generate the internal command pulse IWLP from the write signal WT at a point in time "T714" of the clock signal CK_t. The internal command pulse IWLP may be generated to have a pulse width of 'tw71' by the initialized offset code OFFS<1:N>. The semiconductor device 3 may latch the internal command pulse IWLP, in synchronization with a rising edge R31 of the internal data strobe signal IDQS, to generate the transmission data TDATA having a logic "low" level. When the transmission data TDATA are generated, an edge of the internal data strobe signal IDQS, for latching the internal command pulse IWLP, may be different according to the embodiments.

As illustrated in FIG. 19, the controller 1 may perform the mode register write operation MRW at a point in time "T811" of the clock signal CK_t and may transmit the control signal CA<1:L> to the semiconductor device 3 to set the offset code OFFS<1:N>, controlled according to the transmission data TDATA having a logic "low" level. In FIG. 19, "K=3" means a status that the offset code OFFS<1:N> is controlled three times. The controller 1 may transmit the control signal CA<1:L> to the semiconductor device 3 to perform the write operation WRITE at a point in time "T812" of the clock signal CK_t. The semiconductor device 3 may generate the internal command pulse IWLP, whose pulse width is controlled to have a time of 'tw81' by the offset code OFFS<1:N>. The semiconductor device 3 may latch the internal command pulse IWLP in synchronization with a rising edge R32 of the internal data strobe signal IDQS to generate the transmission data TDATA having a logic "high" level. When the transmission data TDATA has a logic "high" level, the first internal write leveling training operation S71 may terminate.

The semiconductor system 100, according to an embodiment, may adjust a pulse width of the internal command pulse IWLP, according to the offset code OFFS<1:N>, through the first internal write leveling training operation (S71 of FIG. 16), to align the internal data strobe signal IDQS with the internal command pulse IWLP.

Figure 20:
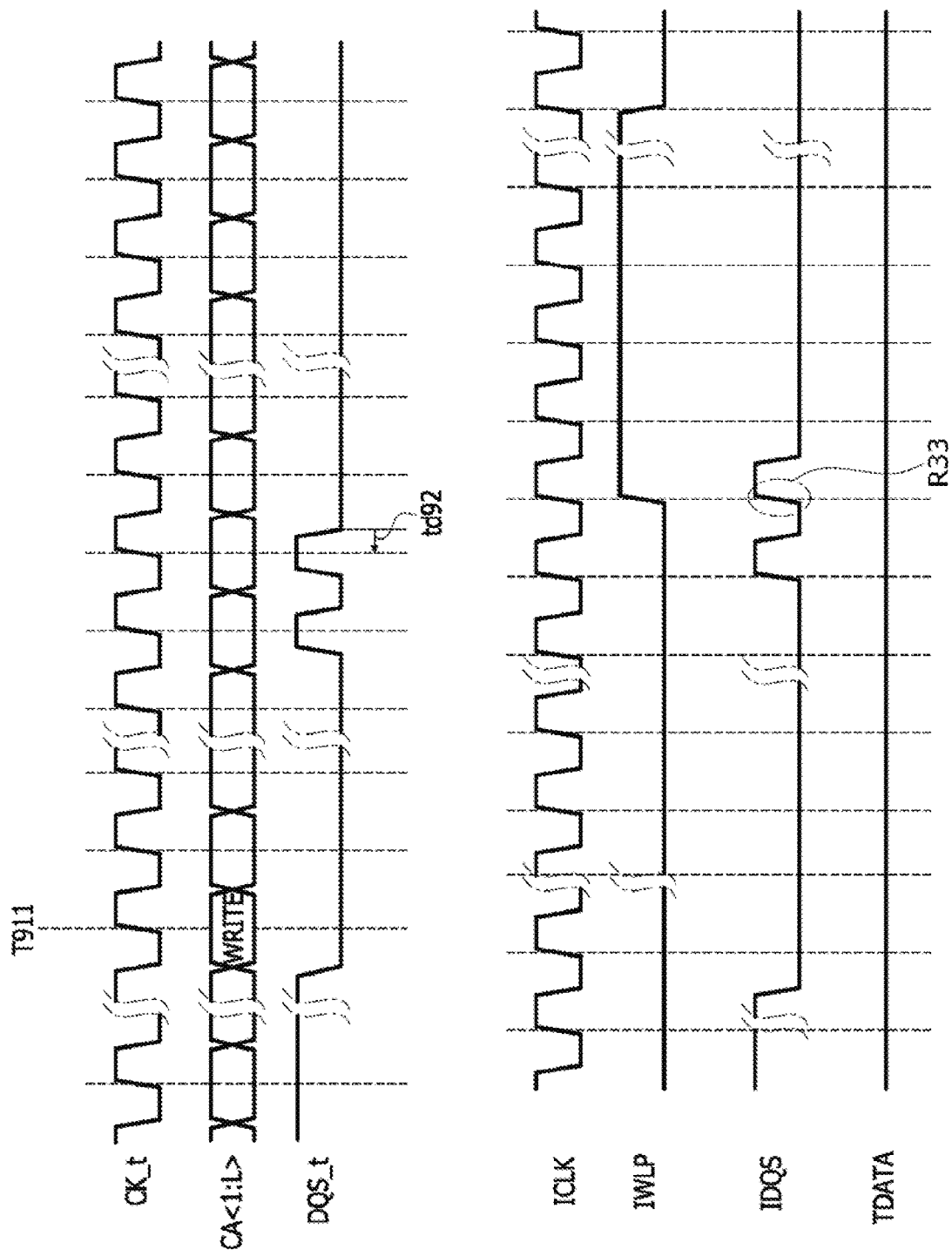

As illustrated in FIG. 20, the controller 1 may transmit the control signal CA<1:L> for performing the write operation WRITE to the semiconductor device 3 at a point in time "T911" of the clock signal CK_t. The semiconductor device 3 may latch the internal command pulse IWLP in synchronization with a rising edge R33 of the internal data strobe signal IDQS to generate the transmission data TDATA. When the transmission data TDATA has a logic "high" level, the controller 1 may iteratively and sequentially perform an operation of controlling a delay period of the data strobe signal DQS_t and an operation of generating the transmission data TDATA according to the write operation. The controller 1 may iteratively and sequentially perform the operation of controlling a delay period of the data strobe signal DQS_t and the operation of generating the transmission data TDATA until the transmission data TDATA has a logic "low" level. When a delay period of the data strobe signal DQS_t transmitted from the controller 1 to the semiconductor device 3 is controlled by a negative period 'td92', the second internal write leveling training operation (S73 of FIG. 16) may terminate because the transmission data TDATA is generated to have a logic "low" level.

The semiconductor system 100, according to an embodiment, may control a delay period of the data strobe signal DQS_t, through the second internal write leveling training operation (S73 of FIG. 16), to more accurately align the internal data strobe signal IDQS with the internal command pulse IWLP.

Figure 21:
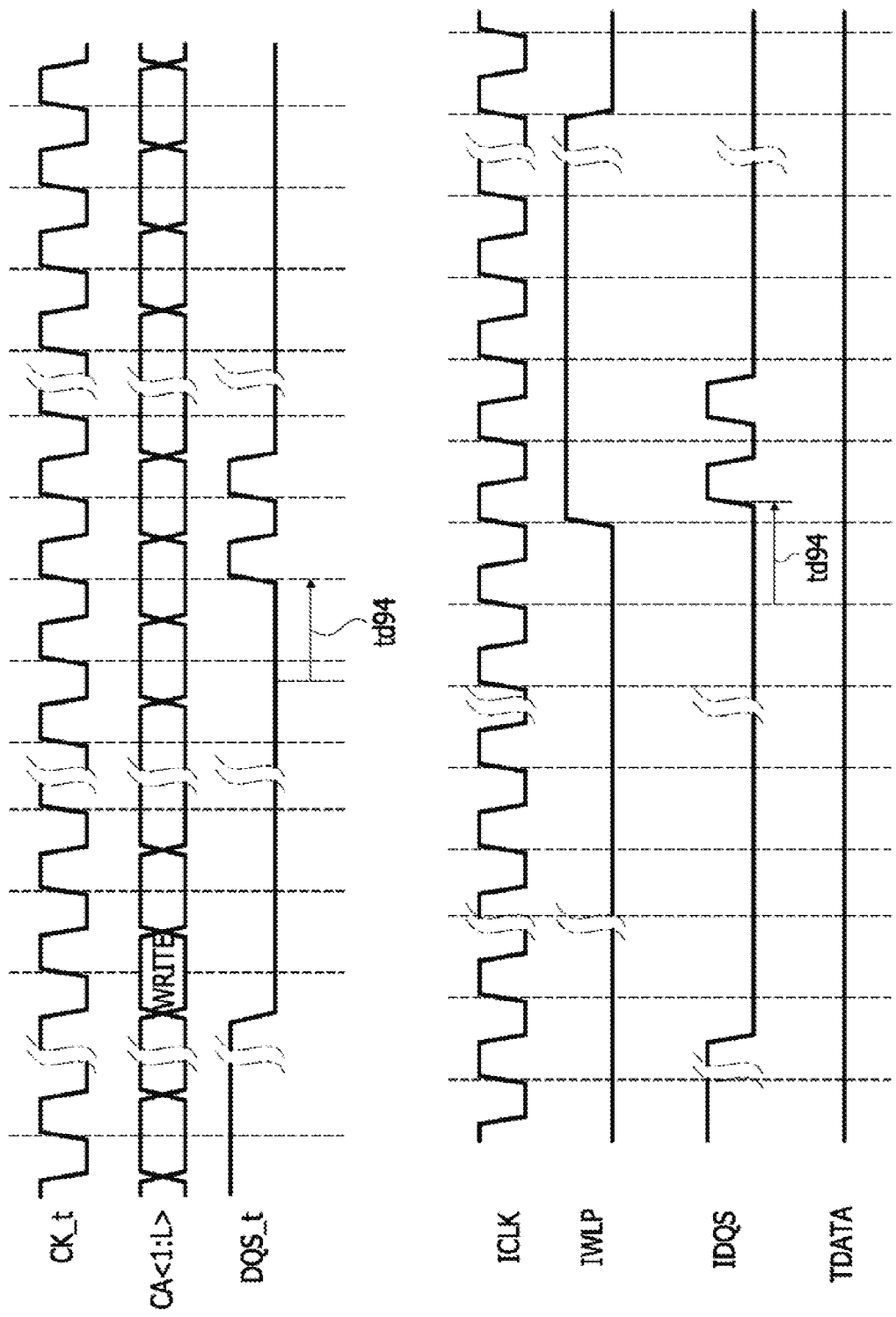

FIG. 21 specifically illustrates the step (S80 of FIG. 16) for applying the positive offset to the data strobe signal DQS_t in the controller 1 to transmit the data strobe signal DQS_t, thereby applying the positive offset to the semiconductor device 3. The positive offset, which is set to be a time 'td94', may be applied to the data strobe signal DQS_t, whose delay period is controlled through the second internal write leveling training operation S73. The positive offset, which is set to be the time 'td94', may also be reflected in the internal data strobe signal IDQS generated from the data strobe signal DQS_t. In the present embodiment, the positive offset may be a time of "1.25×tCK", and this may correspond to a case that a preamble period tWPRE of the data strobe signal DQS_t is set to be a time of "2×tCK". Various positive offsets, which are set according to the preamble period tWPRE of the data strobe signal DQS_t, will be described hereinafter with reference to FIG. 22.

FIG. 22 lists up the negative offsets and the positive offsets which are set according to the preamble period tWPRE of the data strobe signal DQS_t. When the preamble period tWPRE of the data strobe signal DQS_t is "2×tCK", the negative offset may be a time of "−0.75×tCK" and the positive offset may be a time of "1.25×tCK". When the preamble period tWPRE of the data strobe signal DQS_t is "3×tCK", the negative offset may be a time of "−1.25×tCK" and the positive offset may be a time of "1.75×tCK". When the preamble period tWPRE of the data strobe signal DQS_t is "4×tCK", the negative offset may be a time of "−2.25×tCK" and the positive offset may be a time of "2.75×tCK".

According to an embodiment of the present disclosure, when a write signal is shifted to generate an internal command pulse for aligning an internal data strobe signal, a shift period of the write signal may be controlled by an offset code to stably align the internal data strobe signal with the internal command pulse even though a generation timing of the internal data strobe signal varies.

According to an embodiment of the present disclosure, a delay period of a data strobe signal may be controlled to align a delayed strobe signal with the internal command pulse. As a result, it may be possible to extract information on a write latency period to store the information on the write latency period into a mode register circuit.

According to an embodiment of the present disclosure, after controlling a pulse width of the internal data strobe signal using an offset code in an internal write leveling training mode, a delay period of the data strobe signal may be controlled to accurately align the internal data strobe signal with the internal command pulse.

According to an embodiment of the present disclosure, the internal data strobe signal may be controlled to be toggled at around a point in time when the write latency period elapses from a point in time when a write command is applied to a semiconductor device, and a toggling point in time of the internal data strobe signal may be delayed on the basis of a point in time when the internal command pulse is generated. Thus, the internal command pulse may be stably latched and inputted by the toggling internal data strobe signal.

What is claimed is:

1. A method of performing a write leveling training operation, the method comprising:
    performing an external write leveling training operation to generate a feedback signal based on a data strobe signal and an internal write leveling pulse and to control a write latency delay of the data strobe signal based on the feedback signal; and
    performing an internal write leveling training operation to generate the feedback signal based on the data strobe signal and the internal write leveling pulse, which is generated by the write latency delay and a phase alignment, to control the phase alignment based on the feedback signal, and to control the write latency delay of the data strobe signal based on the feedback signal.

2. The method of claim 1, wherein the external write leveling training operation includes:
    (a) activating an external write leveling training mode during a mode register write operation;
    (b) initializing the write latency delay of the data strobe signal;
    (c) discriminating a logic level of the feedback signal generated when a write operation is performed; and
    (d) controlling the write latency delay of the data strobe signal according to a logic level of the feedback signal.

3. The method of claim 2,
    wherein the step (c) and the step (d) are iteratively performed when the feedback signal have a first logic level; and
    wherein the external write leveling training operation terminates when the feedback signal have a second logic level.

4. The method of claim 1, wherein the internal write leveling training operation includes:
    (a) activating an internal write leveling training mode during a mode register write operation;
    (b) initializing the phase alignment;
    (c) generating the feedback signal based on the internal write leveling pulse generated by the phase alignment and discriminating a logic level of the feedback signal when a first write operation is performed; and
    (d) controlling the phase alignment according to a logic level of the feedback signal.

5. The method of claim 4, wherein the step (c) and the step (d) are iteratively performed when the feedback signal have a first logic level.

6. The method of claim 5, wherein when the feedback signal have a second logic level, the step (d) is followed by:
    (e) discriminating a logic level of the feedback signal generated by a second write operation; and
    (f) controlling the write latency delay of the data strobe signal according to a logic level of the feedback signal.

* * * * *